US009508483B2

(12) United States Patent
Mano et al.

(10) Patent No.: US 9,508,483 B2
(45) Date of Patent: Nov. 29, 2016

(54) INDUCTOR DEVICE, METHOD FOR MANUFACTURING THE SAME AND PRINTED WIRING BOARD

(71) Applicant: IBIDEN Co., Ltd., Ogaki-shi (JP)

(72) Inventors: Yasuhiko Mano, Ogaki (JP); Kazuhiro Yoshikawa, Ogaki (JP); Haruhiko Morita, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 190 days.

(21) Appl. No.: 13/927,243

(22) Filed: Jun. 26, 2013

(65) Prior Publication Data

US 2013/0342301 A1 Dec. 26, 2013

(30) Foreign Application Priority Data

Jun. 26, 2012 (JP) ................................ 2012-143230

(51) Int. Cl.

*H01F 5/00* (2006.01)
*H01F 27/28* (2006.01)
*H01F 27/24* (2006.01)
*H05K 1/03* (2006.01)
*H05K 1/11* (2006.01)
*H01F 41/04* (2006.01)

(52) U.S. Cl.

CPC .......... *H01F 27/2804* (2013.01); *H01F 27/24* (2013.01); *H01F 41/041* (2013.01); *H01F 2027/2809* (2013.01); *Y10T 29/4902* (2015.01)

(58) Field of Classification Search

CPC ........... H01F 17/0013; H01F 17/0006; H01F 27/2804; H01F 23/5227; H01F 17/0033

USPC ........ 336/200, 232, 234, 229, 198; 174/255, 174/262, 264

See application file for complete search history.

(56) References Cited

U.S. PATENT DOCUMENTS

| | | | | |
|---|---|---|---|---|
| 6,157,285 | A * | 12/2000 | Tokuda | H01F 17/0013 336/200 |
| 6,236,538 | B1 * | 5/2001 | Yamada et al. | 360/123.6 |
| 7,180,397 | B1 * | 2/2007 | Busletta | H05K 1/165 336/200 |
| 7,187,263 | B2 * | 3/2007 | Vinciarelli | 336/200 |
| 7,843,304 | B2 * | 11/2010 | Schrom et al. | 336/200 |
| 8,022,802 | B2 * | 9/2011 | Schaerrer et al. | 336/200 |
| 2002/0097129 | A1 * | 7/2002 | Johnson | 336/200 |
| 2004/0041679 | A1 * | 3/2004 | Saito et al. | 336/200 |
| 2008/0238602 | A1 * | 10/2008 | Schrom et al. | 336/84 M |
| 2009/0243780 | A1 * | 10/2009 | Inoue et al. | 336/200 |

(Continued)

FOREIGN PATENT DOCUMENTS

JP 2010-123879 A 6/2010

*Primary Examiner* — Elvin G Enad
*Assistant Examiner* — Kazi Hossain
(74) *Attorney, Agent, or Firm* — Oblon, McClelland, Maier & Neustadt, L.L.P.

(57) ABSTRACT

An inductor device for a printed wiring board has an insulation layer having a first penetrating hole penetrating through the insulation layer, a magnetic core structure including a magnetic material filled in the first penetrating hole through the insulation layer such that the magnetic core structure including a first magnetic body layer formed in the first penetrating hole is formed through the insulation layer, and a conductor layer formed on the insulation layer and having an inductor pattern such that the inductor pattern is surrounding the circumference of the magnetic core structure.

16 Claims, 21 Drawing Sheets

(56) References Cited

U.S. PATENT DOCUMENTS

2010/0127812 A1* 5/2010 Maeda .......................... 336/200
2010/0289610 A1* 11/2010 Jacobson et al. ........... 336/84 C
2011/0050380 A1* 3/2011 Nakanishi ..................... 336/200
2011/0156853 A1* 6/2011 Kato ..................... H01F 27/306 336/192
2011/0232948 A1* 9/2011 Sato ..................... H05K 3/4661 174/255
2012/0249282 A1* 10/2012 Sin et al. ...................... 336/200

* cited by examiner (A)

(B)

INDUCTOR DEVICE, METHOD FOR MANUFACTURING THE SAME AND PRINTED WIRING BOARD

CROSS-REFERENCE TO RELATED APPLICATIONS

The present application is based upon and claims the benefit of priority to Japanese Patent Application No. 2012-143230, filed Jun. 26, 2012, the entire contents of which are incorporated herein by reference.

BACKGROUND OF THE INVENTION

Field of the Invention

The present invention relates to an inductor component to be accommodated in a printed wiring board or mounted on a printed wiring board. The present invention also relates to a method for manufacturing such an inductor component and a printed wiring board.

Description of Background Art

In recent years, the number of electronic components to be mounted externally on a printed wiring board has been decreasing as electronic devices are becoming miniaturized and highly functional. For example, Japanese Laid-Open Patent Publication No. 2010-123879 describes a method for forming an inductor element in a printed wiring board. The inductor element is made up of inductor patterns in substantially an annular shape on a planar view and of a magnetic body formed on the inner-circumferential side of the inductor patterns. In Japanese Laid-Open Patent Publication No. 2010-123879, a magnetic body is positioned in the center of inductor patterns so as to enhance inductor characteristics. The entire contents of this publication are incorporated herein by reference.

SUMMARY OF THE INVENTION

According to one aspect of the present invention, an inductor device for a printed wiring board has an insulation layer having a first penetrating hole penetrating through the insulation layer, a magnetic core structure including a magnetic material filled in the first penetrating hole through the insulation layer such that the magnetic core structure including a first magnetic body layer formed in the first penetrating hole is formed through the insulation layer, and a conductor layer formed on the insulation layer and having an inductor pattern such that the inductor pattern is surrounding the circumference of the magnetic core structure.

According to another aspect of the present invention, a method for manufacturing an inductor device for a printed wiring board includes forming on a support base an insulation layer having a first penetrating hole penetrating through the insulation layer, forming on the insulation layer a conductor layer having an inductor pattern such that the inductor pattern is surrounding the circumference of the first penetrating hole formed in the insulation layer, filling a magnetic material in the first penetrating hole such that a magnetic core structure including a first magnetic body layer is formed in the first penetrating hole through the insulation layer and the inductor pattern of the conductor layer surrounds the circumference of the magnetic core structure, forming a second magnetic body layer on the inductor pattern and the insulation layer, and removing the support base from the insulation layer.

According to yet another aspect of the present invention, a printed wiring board has a buildup structure formed of insulation layers and conductive layers, and an inductor device accommodated in or mounted on the buildup structure. The inductor device has an insulation layer having a first penetrating hole penetrating through the insulation layer, a magnetic core structure including a magnetic material filled in the first penetrating hole through the insulation layer such that the magnetic core structure having a first magnetic body layer formed in the first penetrating hole is formed through the insulation layer, and a conductor layer formed on the insulation layer and having an inductor pattern such that the inductor pattern is surrounding the circumference of the magnetic core structure.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
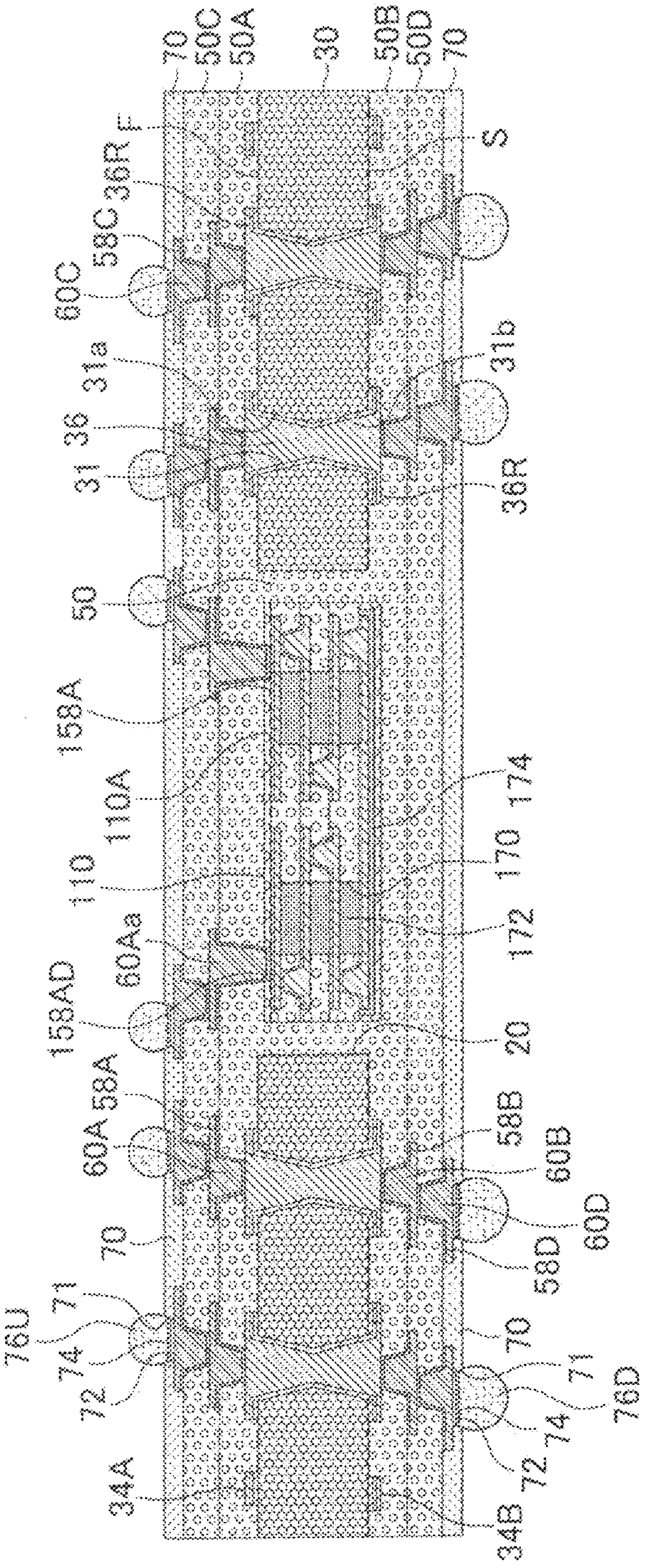
FIG. 1 is a cross-sectional view of a printed wiring board according to a first embodiment of the present invention.

The embodiments will now be described with reference to the accompanying drawings, wherein like reference numerals designate corresponding or identical elements throughout the various drawings.

First Embodiment

FIG. 1 is a cross-sectional view of printed wiring board 10 according to a first embodiment of the present invention. Printed wiring board 10 has insulative base 30 having first surface (F) and second surface (S) opposite the first surface, first conductive layer (34A) on first surface (F) of insulative base 30, second conductive layer (34B) on second surface (S), and through-hole conductors 36 formed in insulative base 30 and connecting first conductive layer (34A) and second conductive layer (34B). Penetrating hole 20 is formed in insulative base 30, and inductor component 110 is accommodated in penetrating hole 20.

Through-hole conductor 36 is formed by filling plating film in penetrating hole 31 for forming a through-hole conductor in the insulative base. Penetrating hole 31 is made up of first opening portion (31*a*) formed on the first-surface side of the insulative base and of second opening portion (31*b*) formed on the second-surface side. First opening portion (31*a*) tapers from the first surface toward the second surface, while second opening portion (31*b*) tapers from the second surface toward the first surface. First opening portion (31*a*) and second opening portion (31*b*) are joined in the insulative base.

A first buildup layer is formed on first surface (F) of insulative base 30 and on inductor component 110. The first buildup layer includes insulation layer (50A) formed to cover first surface (F) of insulative base 30 and inductor component 110, conductive layer (upper conductive layer) (58A) on insulation layer (50A), and via conductors (60A) that penetrate through insulation layer (50A) and connect conductive layer (58A) and the first conductive layer or through-hole conductors. Moreover, connection via conductors (60Aa) connecting electrodes (158AD) of the inductor component and conductive layer (58A) are formed in insulation layer (50A). The first buildup layer further includes insulation layer (50C), conductive layer (uppermost conductive layer) (58C) on insulation layer (50C), and via conductors (60C) that penetrate through insulation layer (50C) and connect conductive layer (58C) and conductive layer (58A) or via conductors (60A, 60Aa).

A second buildup layer is formed on second surface (S) of insulative base 30 and on inductor component 110. The second buildup layer includes insulation layer (50B) formed on second surface (S) of insulative base 30 and on the inductor component, conductive layer (58B) on insulation layer (50B), and via conductors (60B) that penetrate through insulation layer (50B) and connect conductive layer (58B) and the second conductive layer or through-hole conductors. The second buildup layer further includes insulation layer (50D), conductive layer (58D) on insulation layer (50D), and via conductors (60D) that penetrate through insulation layer (50D) and connect conductive layer (58B) and conductive layer (58D).

Solder resist layers 70 with openings 71 are formed on the first buildup layer and on the second buildup layer. Top surfaces of conductive layers (58C, 58D) and via conductors (60C, 60D) exposed through openings 71 of solder-resist layers 70 work as pads. Metal films (72, 74) made of Ni/Au, Ni/Pd/Au or the like are formed on the pads, and solder bumps (76U, 76D) are formed on the metal films. An IC chip is mounted on the printed wiring board through solder bumps (76U), and the printed wiring board is mounted on a motherboard through solder bumps (76D).

In printed wiring board 10 of the first embodiment, inductor component 110 is accommodated in penetrating hole 20 of insulative base 30. Filler 50 is filled in penetrating hole 20. Filler 50 is filled in the space between side walls of opening 20 (side walls in the insulative base exposed by opening 20) and inductor component 110. Accordingly, inductor component 110 is secured inside penetrating hole 20.

Here, insulation layers (50A, 50B) formed on both surfaces of insulative base 30 contain core material such as glass cloth, and insulation layers (50C, 50D) positioned on their respective external sides of insulation layers (50A, 50B) do not contain core material. By employing insulation layers (50A, 50B) with core material, warping caused by thermal history while buildup layers are formed, for example, is suppressed.

In the first embodiment, an inductor component is built into the insulative base, allowing the inductor component to be built into a printed wiring board without increasing the number of insulation layers. Even when an inductor component formed by alternately laminating multiple inductor patterns and resin insulation layers is built into a printed wiring board, the number of insulation layers on the insulative base (interlayer resin insulation layers in the first or second buildup layer) does not increase in the first embodiment. The thickness of an insulative base is usually greater than the thickness of insulation layers on the insulative base. Thus, in the first embodiment, an inductor component with a greater number of inductor patterns can be built into a printed wiring board without increasing the number of insulation layers on the insulative base. An inductor component with high inductance is built into a thin printed wiring board. In the first embodiment, increasing the number of conductive layers of the buildup layers is not required to enhance the inductance of an inductor formed in a printed wiring board. If multiple inductor patterns are formed in a buildup layer, they would increase the difference in the amount of conductors on the first-surface side and second-surface side of the insulative base, and warping is more likely to occur. However, in the first embodiment, since no inductor pattern is formed in the first buildup layer or the second buildup layer, the difference in the amount of conductors decreases on the first-surface side and second-surface side of the insulative base. As a result, warping in the printed wiring board is small.

Figure 2:
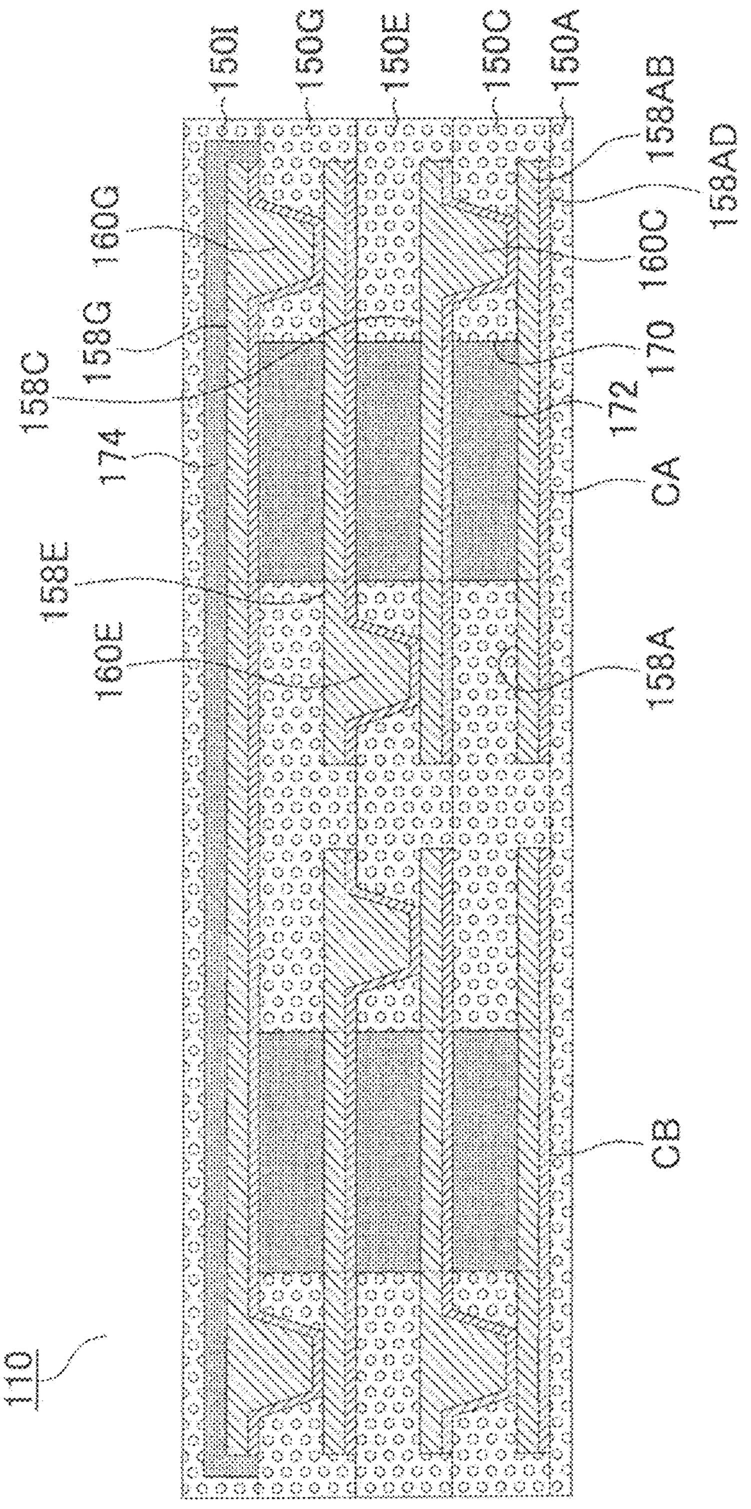
FIG. 2 is a cross-sectional view of an inductor component according to the first embodiment.

FIG. 2 is an enlarged view of inductor component 110 in FIG. 1. Inductor component 110 includes the following: lowermost resin insulation layer (150A); inductor pattern (158A) on insulation layer (150A); insulation layer (150C) formed on insulation layer (150A) to cover inductor pattern (158A); inductor pattern (158C) on insulation layer (150C); insulation layer (150E) formed on insulation layer (150C) to cover inductor pattern (158C); inductor pattern (158E) on insulation layer (150E); insulation layer (150G) formed on insulation layer (150E) to cover inductor pattern (158E); inductor pattern (158G) on insulation layer (150G); second magnetic body layer 174 formed on insulation layer (150G) to cover inductor pattern (158G); and insulation layer (150I) formed on insulation layer (150G) to cover second magnetic body layer 174. Inductor patterns positioned on different layers are connected to each other by their respective via conductors (160C, 160E, 160G) formed in insulation layers (150C, 150E, 150G) respectively. Electrode (158AD) is formed on inductor pattern (158A).

Part of first inductor pattern (158A) works as electrode (158AD). Connection via conductor (160C) is formed on electrode (158AD). The inductor component of the first embodiment has resin insulation layers and inductor patterns laminated alternately, and inductor patterns on different layers are connected by via conductors in resin insulation layers. The inductor component of the first embodiment includes multiple laminated coils (CA, CB), and those laminated coils are each connected parallel or in series. The inductor component in FIG. 2 is formed with two laminated coils (CA: left in the view, CB: right in the view). The laminated coils are easy to connect.

In resin insulation layers (150C, 150E, 150G) sandwiched by inductor patterns, penetrating hole 170 is formed to be concentric to the inductor patterns, and columnar first magnetic body layer 172 is filled in the penetrating hole. Also, second magnetic body layer 174 covers inductor pattern (158G). First magnetic body layer 172 and second magnetic body layer 174 are made of the same material, using resin containing magnetic particles of iron-nickel alloy, iron alloy, amorphous alloy or the like. The amount of magnetic particles is 30~60 vol. %. First magnetic body layer 172 made of resin with magnetic particles mixed in is positioned in the center of inductor patterns, and second magnetic body layer 174 is positioned on the outer side of inductor pattern (158G). By so setting, the magnetic permeability is enhanced. Accordingly, desired inductance is achieved using a thin inductor component with fewer layers, thus reducing the thickness of a printed wiring board with the inductor component built into the insulative base.

In the first embodiment, a first magnetic body layer (magnetic core) is formed in the vicinity of the center of the inductor to achieve higher inductance with fewer coils.

Moreover, by forming a magnetic body layer on the outermost inductor pattern of the inductor component, magnetic flux in the inductor component seldom leaks outside. To prevent a reduction of inductance values or lowered Q factor, regions without conductive circuits are not required to be formed directly on or directly under the inductor component. Volumes of conductive circuits in the first and second buildup layers seldom become unbalanced. A printed wiring board with smaller warping is provided.

Figure 3:
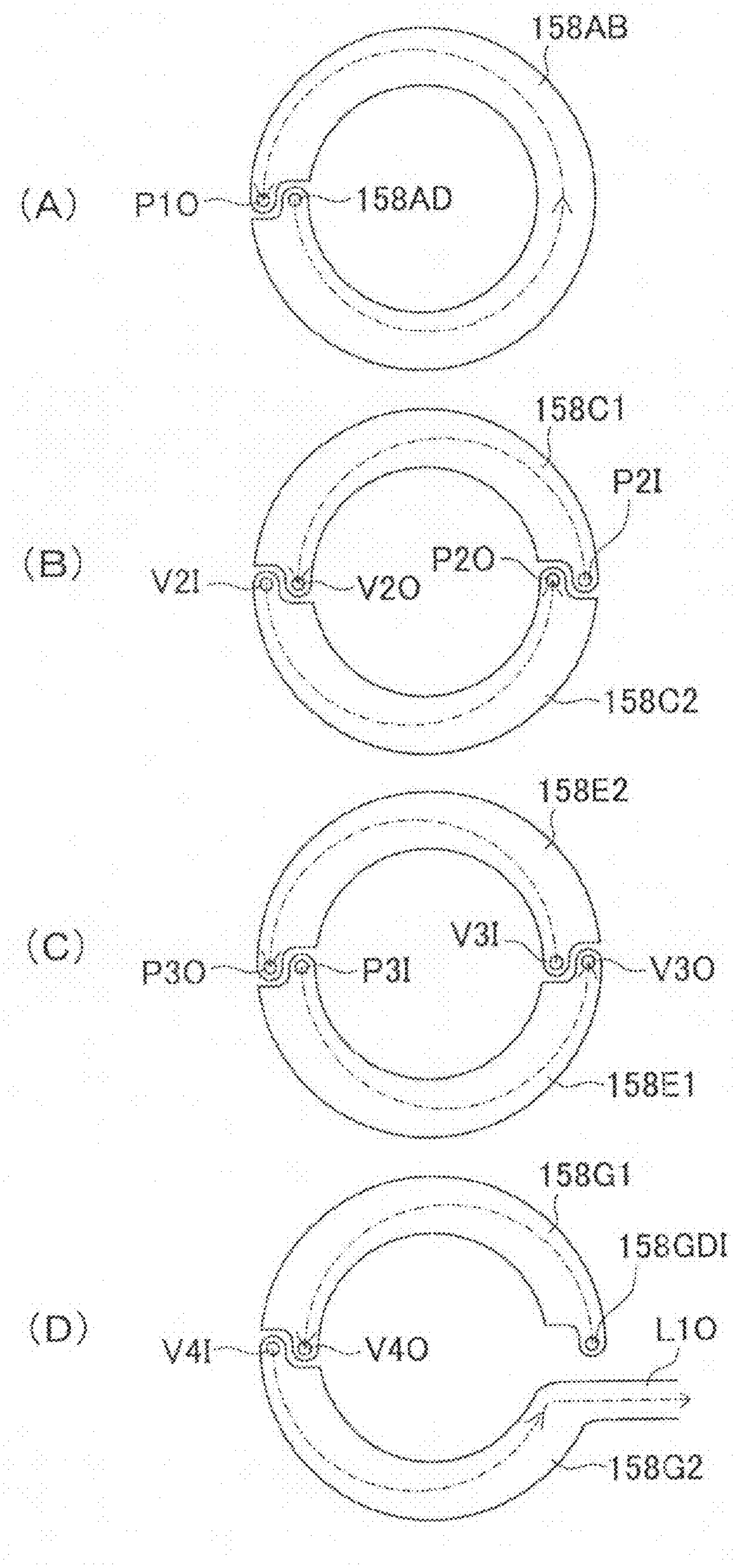
FIGS. 3(A)-3(D) are plan views showing each inductor pattern of the inductor component according to the first embodiment.
Figure 4:
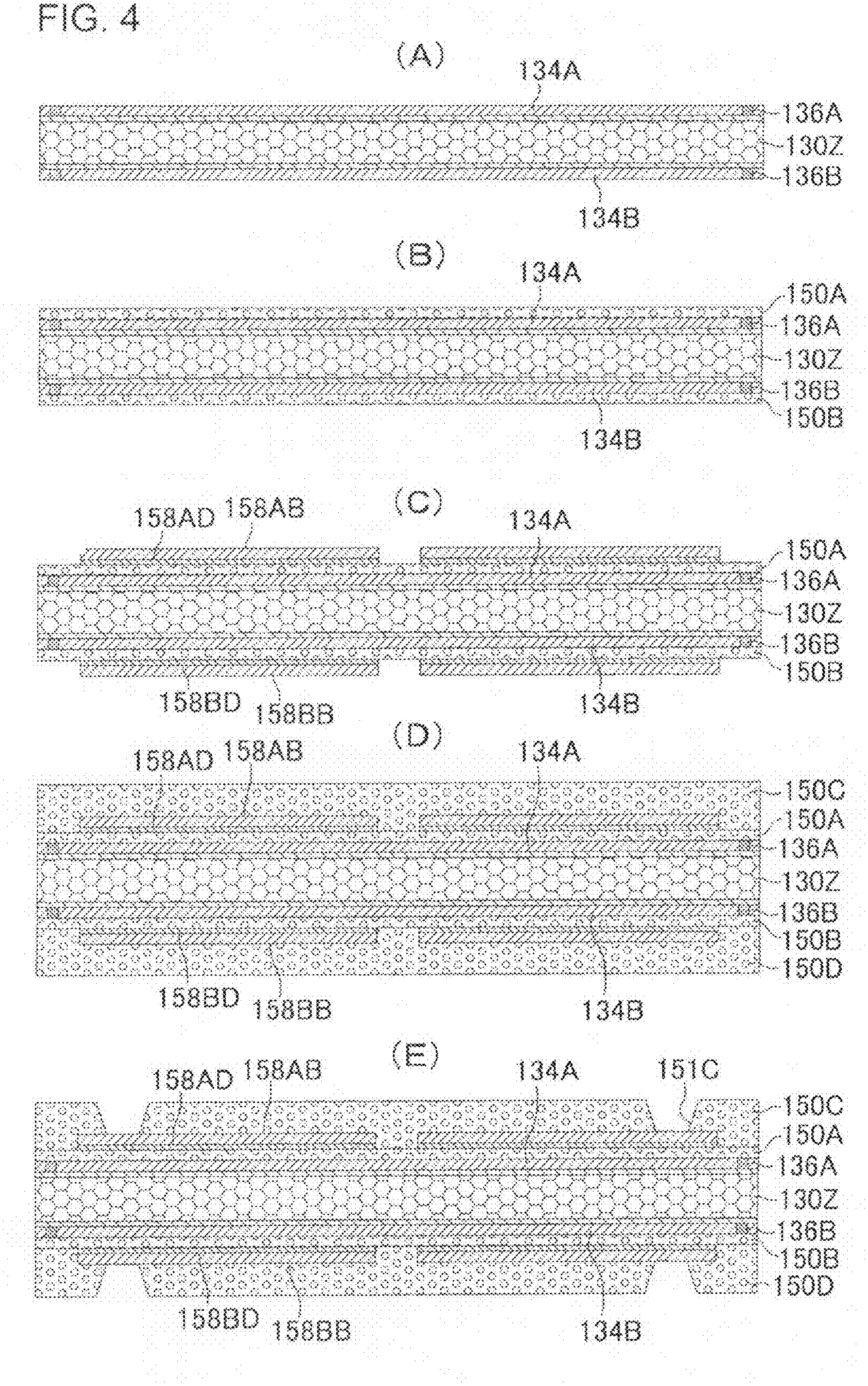
FIGS. 4(A)-4(E) are views of steps showing a method for manufacturing an inductor component according to the first embodiment.

FIG. 3 shows an example of a laminated coil. Via conductor (60Aa) shown in FIG. 1 (connection via conductor in the first buildup layer) is connected to electrode (input electrode) (158AD) of fourth inductor pattern (uppermost inductor pattern) (158AB), electric current flows counterclockwise in substantially a circle and reaches output connection portion (P10) of first inductor pattern (158AB) (FIG. 3(A)). Fourth inductor pattern (158AB) is connected to input via pad (V2I) of third inductor pattern (158C1) through via conductor (160C). Electric current flows counterclockwise in substantially a semicircle, and reaches input connection portion (V3I) of second inductor pattern (158E2) (FIG. 3(C)). Second inductor pattern (158E2) is connected to input via pad (V4I) of fourth inductor pattern (158G2) through via conductor (160G) (FIG. 3(D)). Electric current flows counterclockwise in substantially a semicircle, reaches input connection portion (L10) of first inductor pattern (158G2), and is output to the adjacent laminated coil.

Meanwhile, the output from the adjacent laminated coil is connected to first inductor pattern (158G1) from input pad (158GDI) (FIG. 3(D)). Electric current flows counterclockwise in substantially a semicircle through first inductor pattern (158G1) and is connected from output via pad (V40) of first inductor pattern (158G1) to input connection portion (P31) of second inductor pattern (158E1) through via conductor (160G) (FIG. 3(C)). Electric current flows counterclockwise in a semicircle and reaches input via pad (P2I) of third inductor pattern (158C1) (FIG. 3(B)). The second inductor pattern is connected to output connection portion (158AD) of fourth inductor pattern (158E2) through via conductor (160C) (FIG. 3(A)).

The fourth inductor pattern (uppermost inductor pattern) is formed with a wiring pattern in a semicircular coil shape. Inductor patterns except for the lowermost inductor pattern are made up of two wiring patterns. In the first embodiment, a laminated coil is connected through connection wiring (L10) to its adjacent laminated coil having the same shape. Inductor component 110 of the first embodiment is formed with two laminated coils.

When an inductor component includes multiple laminated inductors, the inductor component may include a common output electrode to share. In such a case, laminated inductors are connected to each other in parallel. A connection via conductor may be formed on each output electrode of the laminated coils. In such a case, each laminated coil is connected to a connection terminal through a connection circuit in a buildup layer. Multiple laminated coils are connected in the buildup layer. When multiple laminated coils are connected in parallel, multiple laminated coils are connected at low resistance. Thus, a low-resistance inductor component is obtained even if the inductor component is formed with multiple laminated coils.

The inductor component shown in FIGS. 2 and 3 has electrodes. Thus, when such an inductor component is built into the insulative base of a printed wiring board, openings for connection via conductors are formed on the electrodes. Connection reliability is high between the electrodes of the inductor component and connection via conductors.

The inductor component may be coated with resin film containing inorganic particles. Resin film is not magnetic. In addition to particles, resin film or coating film contains resin such as epoxy. Thus, bonding strength between the inductor component and resin filler is enhanced, preventing defects such as disconnection in conductive layers of a printed wiring board caused when peeling occurs between the inductor component and resin filler. Other than magnetic particles, coating film may also contain inorganic particles that are not magnetic. Silica particles and alumina particles are examples of inorganic particles that are not magnetic. The thermal expansion coefficient of the coating film is reduced.

The inductor component is formed with resin insulation layers and inductor patterns laminated alternately, and has electrodes to be connected to connection via conductors of the printed wiring board. Thus, the thickness of the inductor component is adjustable by adjusting the number of resin insulation layers and the number of inductor patterns. Therefore, the inductor component is manufactured by considering the thickness of the insulative base. Then, the inductance value is adjusted by the number of inductor patterns and the number of laminated inductors. Therefore, the inductor component of an embodiment of the present invention is suitable for a component to be built into the insulative base. Also, since the printed wiring board and the inductor component are connected by connection via conductors, the inductor component of an embodiment of the present invention is suitable for a component to be built into a printed wiring board. The inductor component may be covered by resin film that is not magnetic. Deterioration of the inductor component is suppressed.

In the embodiment, buildup layers and the inductor component are manufactured by technology used in the technological field of printed wiring boards. Since buildup layers and the inductor component are manufactured separately, the thickness of inductor wiring patterns may be set greater than the thickness of the conductive layers of buildup layers. Thus, a low-resistance inductor component is built into a printed wiring board, and a printed wiring board with fine conductive circuits is obtained. The thickness of inductor wiring patterns is preferred to be 1.2~3 times the thickness of the conductive layers of buildup layers. An inductor component with low resistance and high inductance is obtained. A thin printed wiring board with fine circuits is obtained.

In addition, the surface of each inductor pattern may be roughened. In such a case, adhesiveness with resin insulation layers and magnetic body layers improves. Moreover, the inner wall of penetrating hole 170 may also be roughened. In such a case, adhesiveness improves between the magnetic body layer filled in penetrating hole 170 and resin insulation layers.

FIGS. 4~8 show steps for manufacturing the inductor component according to the first embodiment.

Forming Resin Insulative Material Containing Magnetic Particles (A) Preparing Resin-Containing Solution In a mixed solvent containing 6.8 grams of MEK and 27.2 grams of xylene, 85 grams of epoxy resin (brand name: Epikote 1007, made by Japan Epoxy Resin Co., Ltd.) and magnetic particles of iron (III) oxide or the like are added. Examples of magnetic particles are chromium ferrite (ferrichrome), cobalt ferrite, barium ferrite and the like.

(B) Forming Magnetic-Material Solution

Dicyanamide as a curing agent (brand name: CG-1200, made by BTI Japan) and a curing catalyst (brand name: Curezol 2E4HZ, made by Shikoku Chemical Corporation) are added to the resin-containing solution prepared in (A) above. Then, the mixture is blended using a three-roll mill to form a magnetic-material solution. The amounts of the curing agent and curing catalyst are each 3.3 grams based on 100 grams of epoxy. The magnetic-material solution is applied on a polyethylene terephthalate sheet using a roll coater (made by Cermatronics Boeki Co., Ltd.). Then, the solution is heated and dried under conditions of 160° C. for 5 minutes to remove the solvent. Film for magnetic body layers containing magnetic particles is obtained. The thickness is approximately 20 μm~50 μm. The amount of magnetic particles in the magnetic-material solution and film for magnetic body layers is 30 vol. %~60 vol. %.

Commercially available double-sided copper-clad laminate (130Z) and copper foils (134A, 134B) are prepared, and the copper foils are laminated on both surfaces of the double-sided copper-clad laminate. The peripheries of copper foils and peripheries of double-sided copper-clad laminate (130Z) as a support sheet are bonded using ultrasound (FIG. 4(A)). Bonded portions are shown as (136A, 136B) in FIG. 4(A). Interlayer resin insulation film is laminated on copper foils (134A, 134B) and cured to form resin insulation layers (150A, 150B) (FIG. 4(B)). First inductor patterns (158AB, 158BB) made of Cu/Ni/Cu film are formed on resin insulation layers (150A, 150B) (FIG. 4(C)). Interlayer resin insulation film is laminated on first inductor patterns (158AB, 158BB) and cured to form resin insulation layers (150C, 150D) (FIG. 4(D)). Resin insulation layers of the first embodiment are made of resin such as epoxy and inorganic particles. A laser is used to form openings (151C) in resin insulation layer (150C) and openings (151D) in resin insulation layer (150D) (FIG. 4(E)).

Resin insulation layers of the first embodiment contain a resin that is relatively soluble in a roughening solution and a resin that is relatively insoluble. Resins relatively soluble in a roughening solution are, for example, thermoplastic resins such as polyethylene resin, polypropylene resin, polyester resin, polystyrene resin, acrylic resin, polyamide and polyethylene terephthalate. Resins relatively insoluble in a roughening solution are epoxy-based resins described above.

Figure 5:
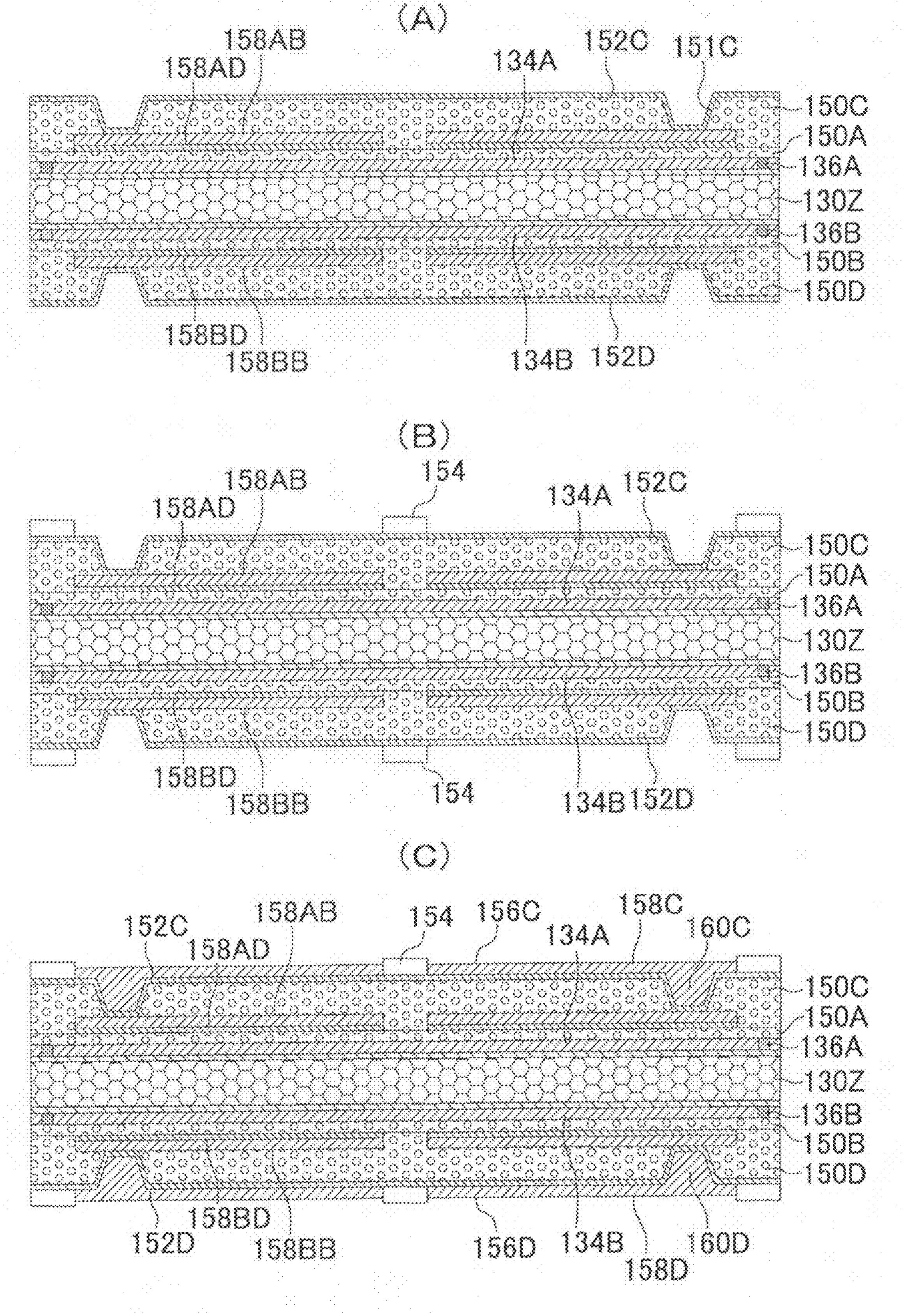
FIGS. 5(A)-5(C) are views of steps showing a method for manufacturing an inductor component according to the first embodiment.
Figure 6:
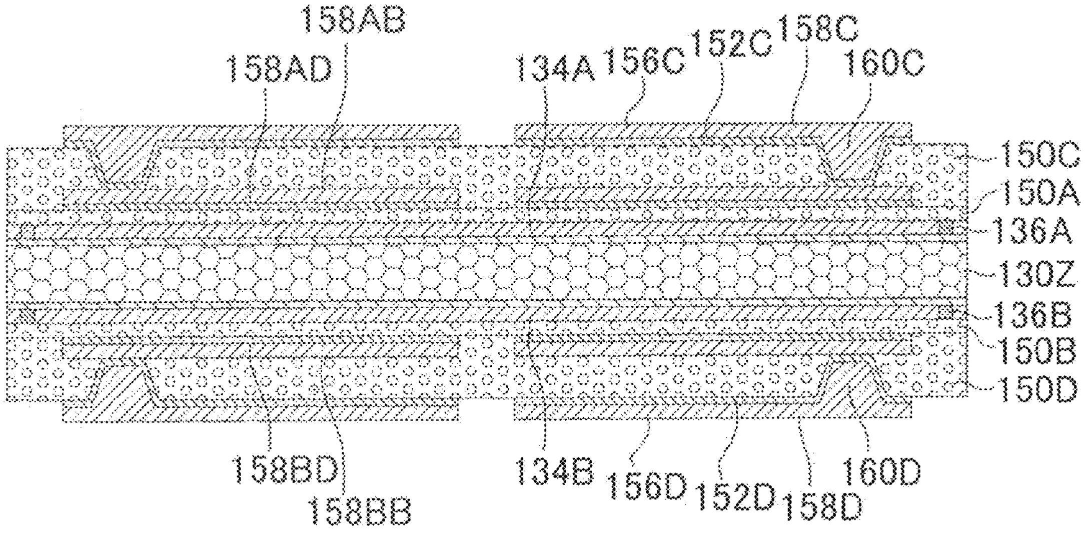
FIGS. 6(A)-6(B) are views of steps showing a method for manufacturing an inductor component according to the first embodiment.
Figure 6:
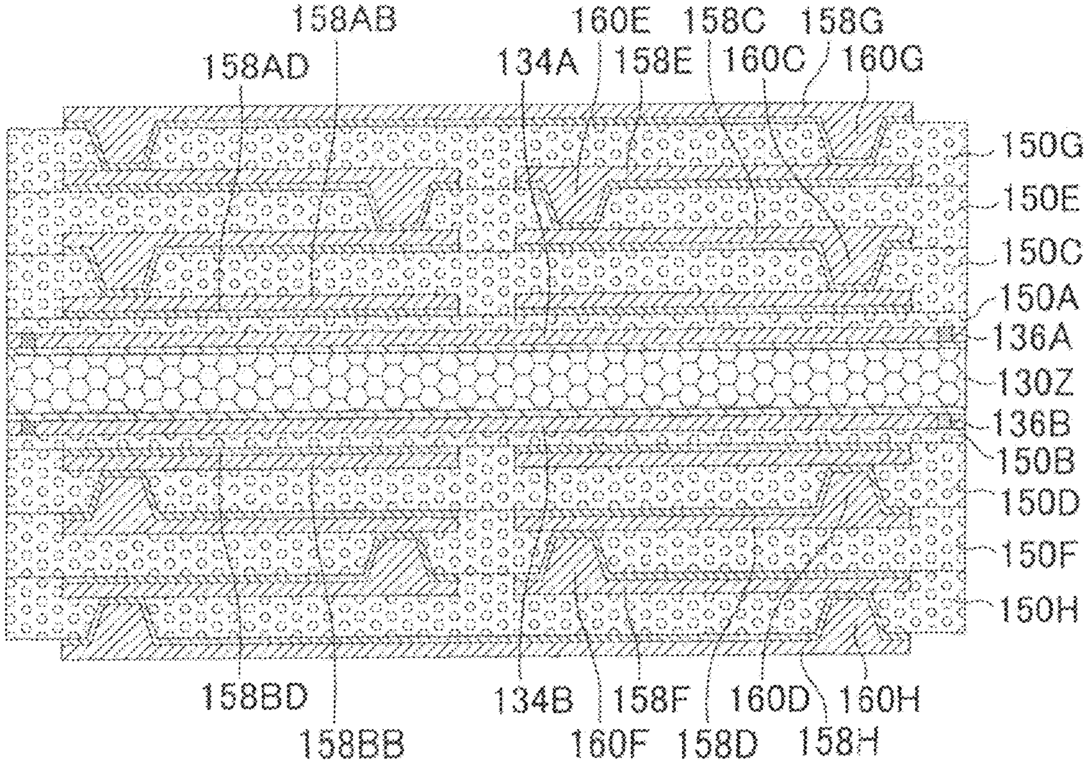
Figure 7:
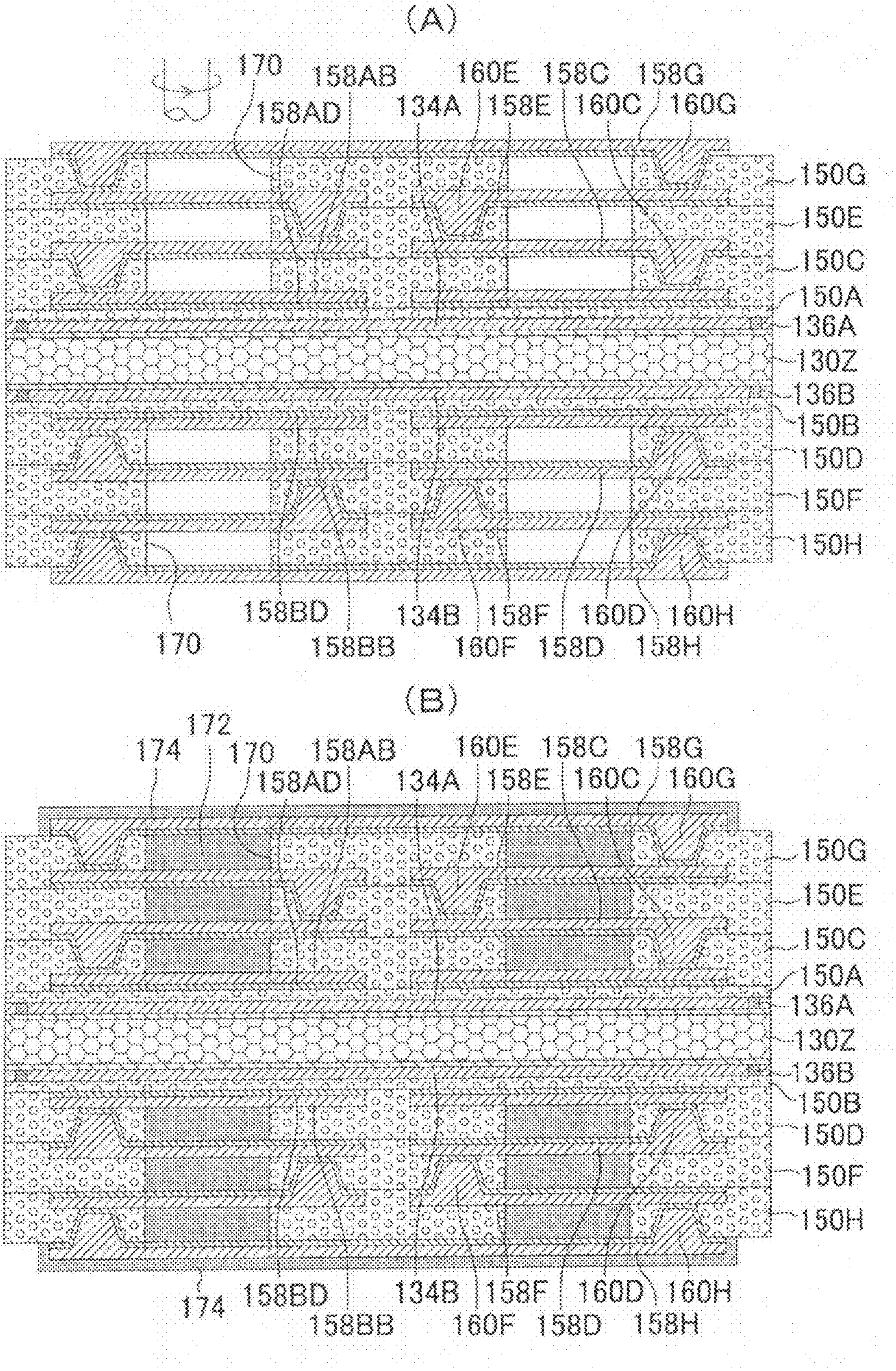
FIGS. 7(A)-7(B) are views of steps showing a method for manufacturing an inductor component according to the first embodiment.
Figure 8:
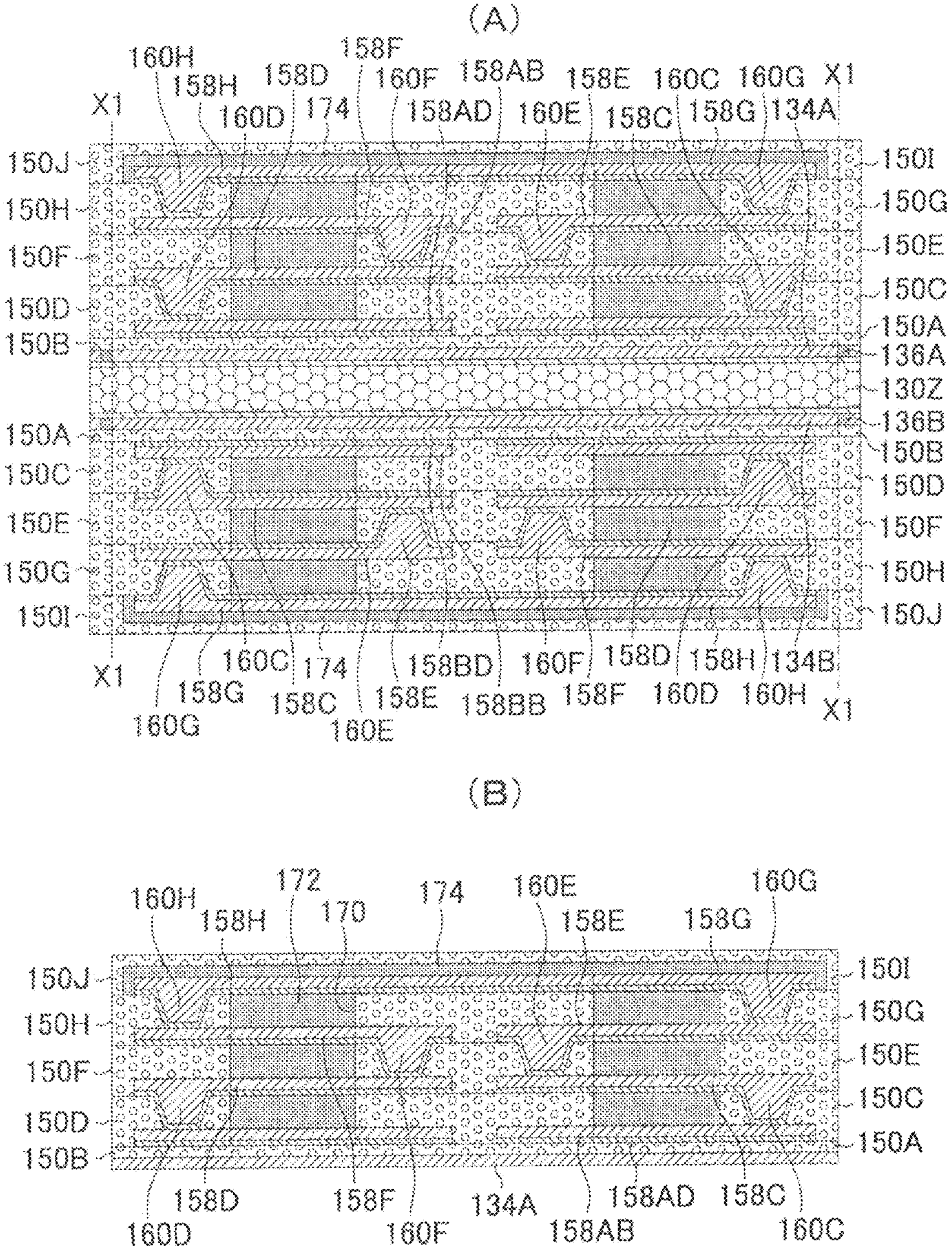
FIGS. 8(A)-8(B) are views of steps showing a method for manufacturing an inductor component according to the first embodiment.
Figure 9:
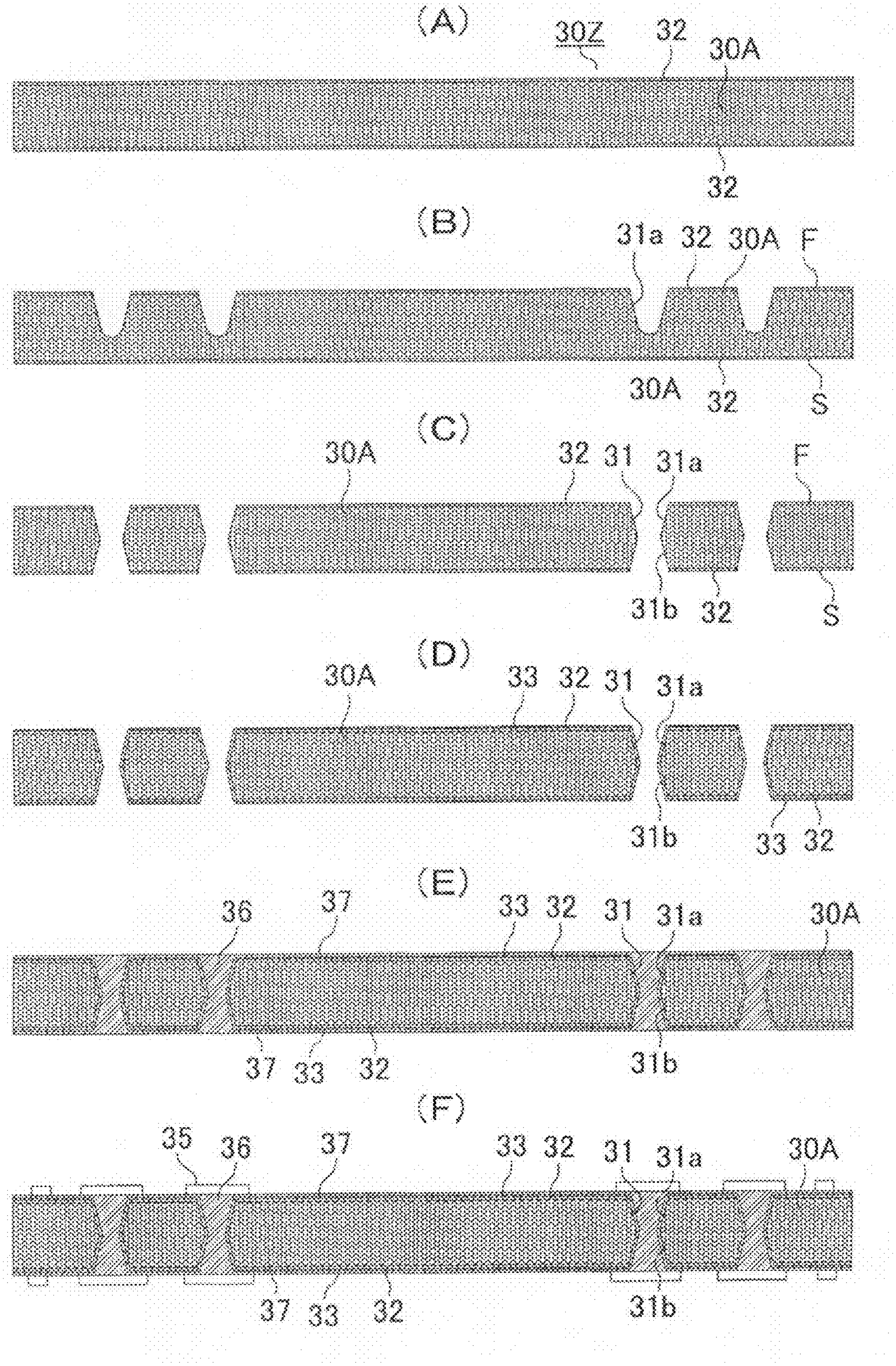
FIGS. 9(A)-9(F) are views of steps showing a method for manufacturing a printed wiring board according to the first embodiment.
Figure 10:
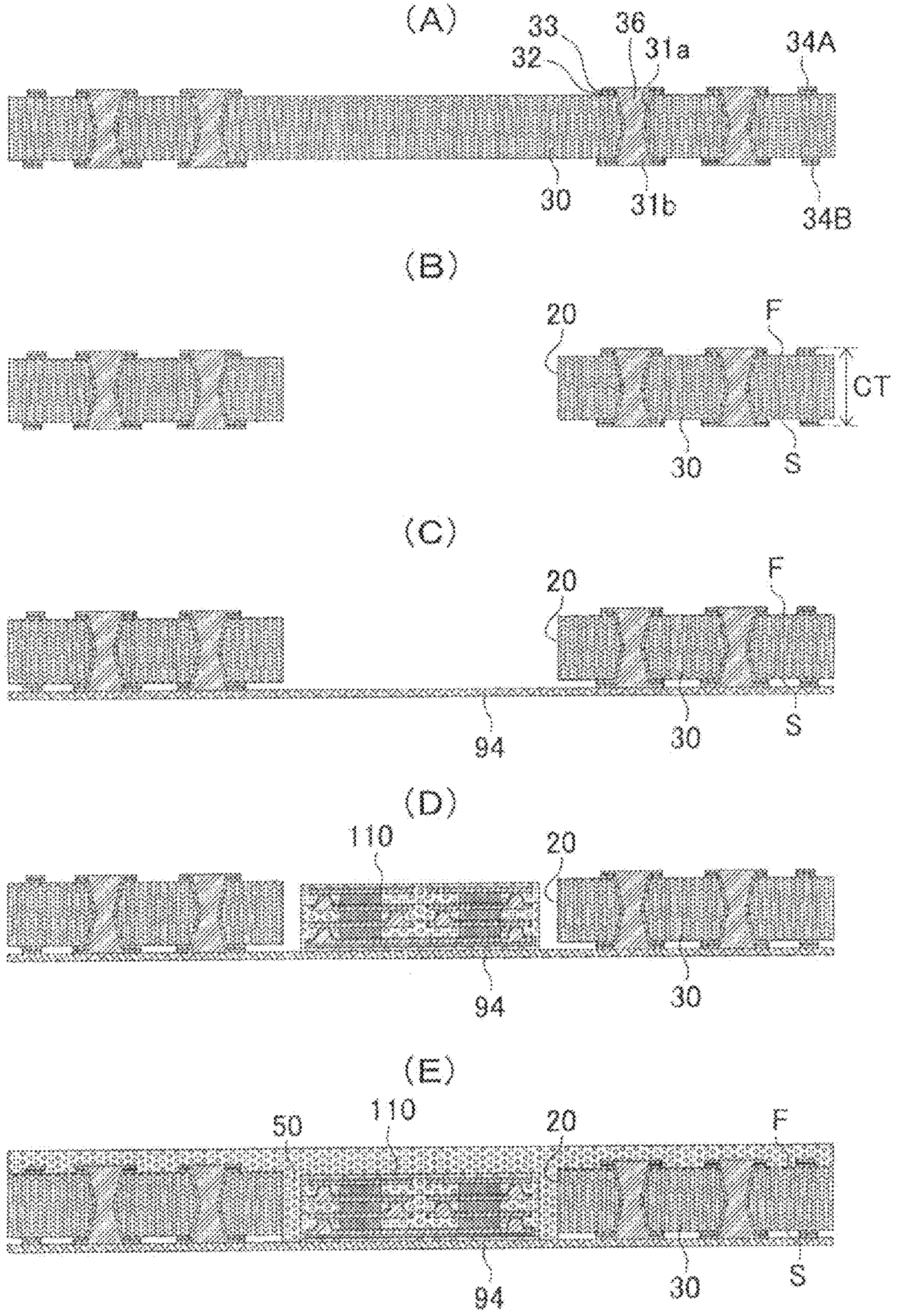
FIGS. 10(A)-10(E) are views of steps showing a method for manufacturing a printed wiring board according to the first embodiment.
Figure 11:
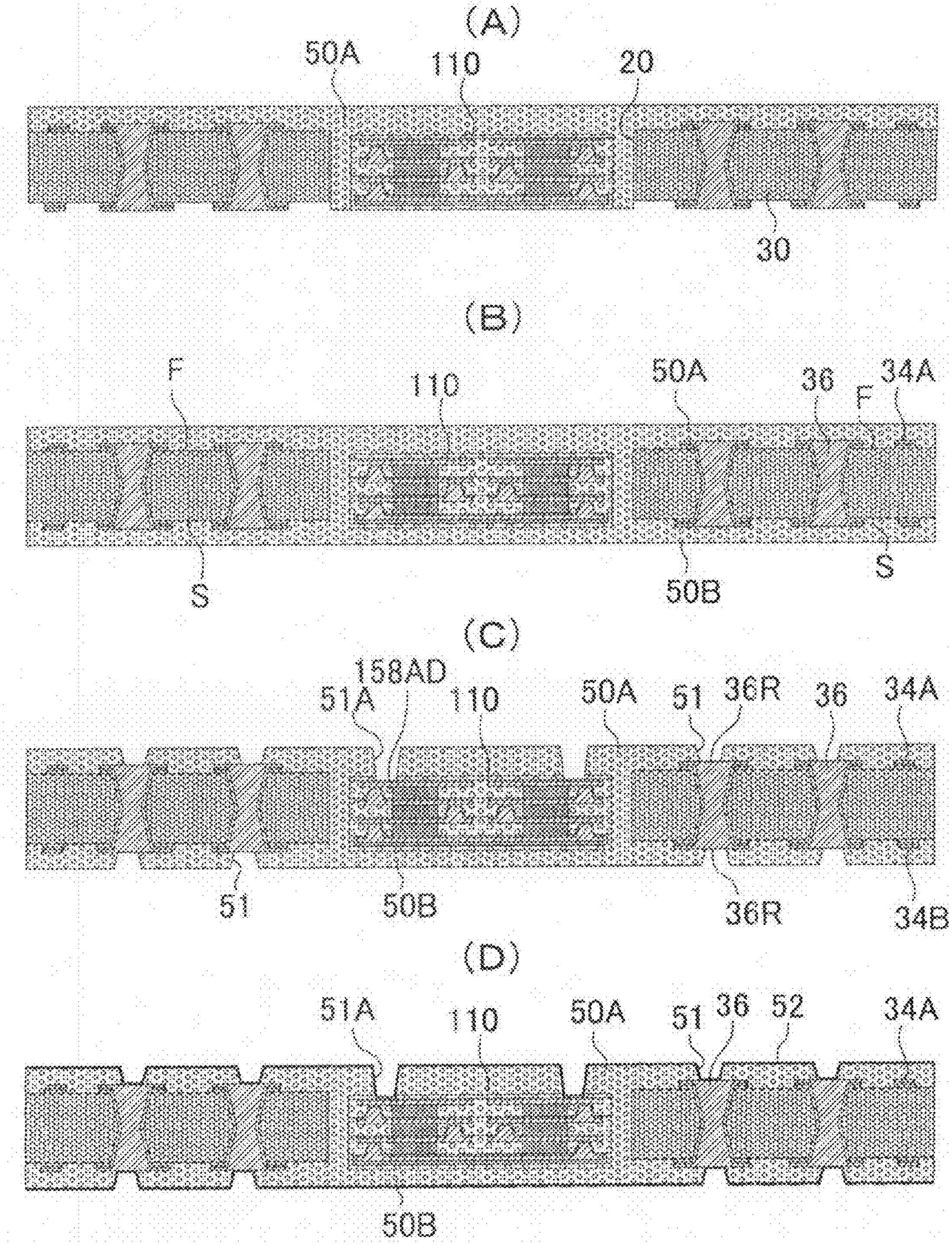
FIGS. 11(A)-11(D) are views of steps showing a method for manufacturing a printed wiring board according to the first embodiment.
Figure 12:
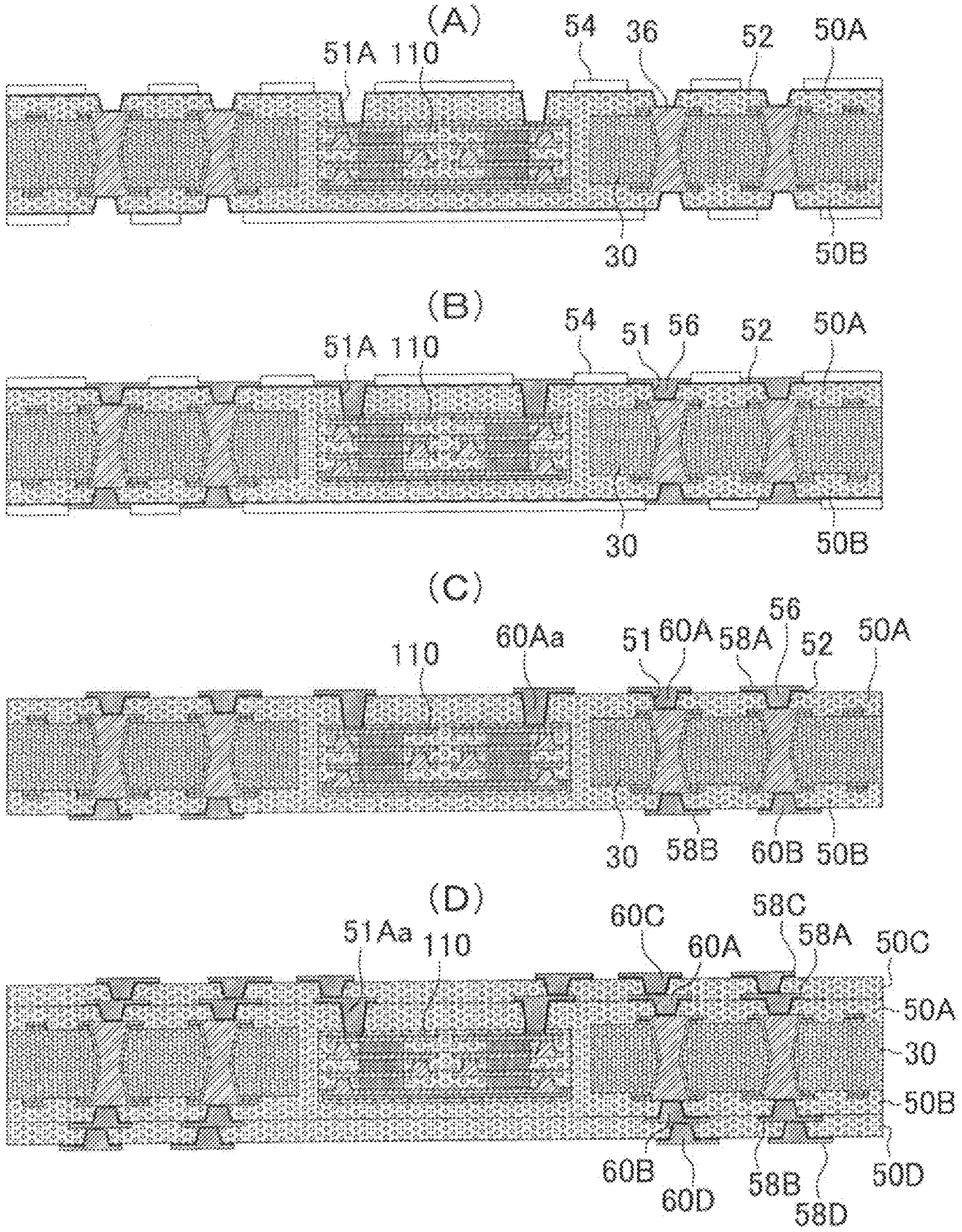
FIGS. 12(A)-12(D) are views of steps showing a method for manufacturing a printed wiring board according to the first embodiment.
Figure 13:
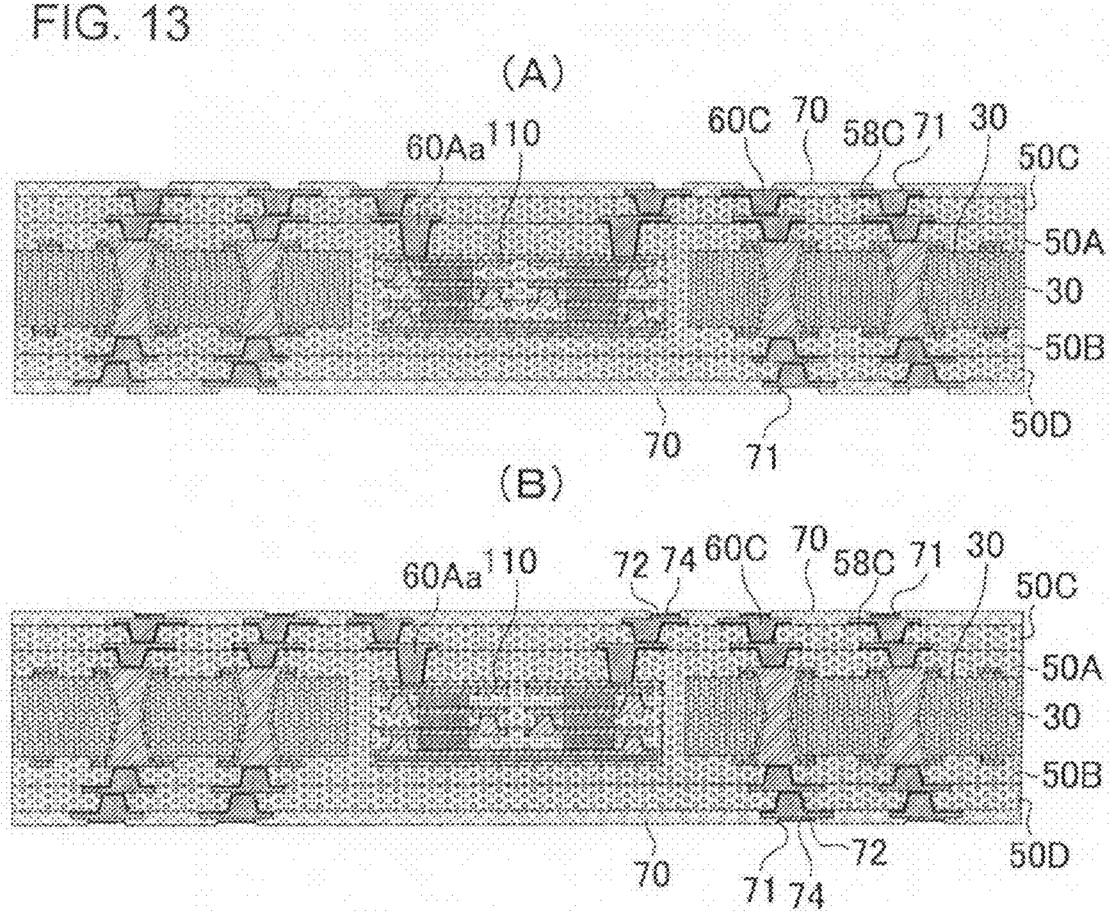
FIGS. 13(A)-13(B) are views of steps showing a method for manufacturing a printed wiring board according to the first embodiment.

Electroless plated films (152C, 152D) are formed on resin insulation layers (150C, 150D) (FIG. 5(A)). Plating resists (154, 154) with a predetermined pattern are formed on the electroless plated films (FIG. 5(B)), and electrolytic plated films (156C, 156D) are formed on portions of electroless plated films (152C, 152D) exposed from plating resists (FIG. 5(C)). Then, the plating resists are removed, and electroless plated films between portions of electrolytic plated films (156C, 156D) are removed. Inductor patterns (158C, 158D) and via conductors (160C, 160D), which are made up of electroless plated films (152C, 152D) and electrolytic plated films (156C, 156D) on the electroless plated films, are formed (FIG. 6(A)). Procedures shown in FIGS. 4(C)~6(A) are repeated to form resin insulation layers (150E, 150F) having via conductors (160E, 160F) and inductor patterns (158E, 158F) along with resin insulation layers (150G, 150H) having via conductors (160G, 160H) and inductor patterns (158G, 158H) (FIG. 6(B)).

Using a laser, for example, penetrating holes 170, which are to be concentric to their respective inductor patterns, are formed in resin insulation layers (150G, 150E, 150C) and resin insulation layers (150H, 150F, 150D) (FIG. 7(A)). The above-described magnetic-material solution is filled in penetrating holes 170, and the above-described magnetic-layer film is laminated on inductor patterns (158G, 158H) and thermally cured so that first magnetic body layer 172 is formed in penetrating holes 170 and second magnetic body layer 174 is formed on inductor patterns (158G, 158H) (FIG. 7(B)). Resin insulation layers (150I, 150J) are formed on second magnetic body layers (174, 174) (FIG. 8(A)).

Using a router or the like, the laminate is cut along lines (X1, X1) inside bonding portions (136A, 136B) as shown in FIG. 8(A). The laminate is separated into double-sided copper-clad laminate 130 and laminated coils with copper foils (134A, 134B) (FIG. 8(B)). Copper foil (134A) is removed by etching. Inductor component 110 is completed (FIG. 2).

FIGS. 9~13 show a method for manufacturing printed wiring board 10 according to the first embodiment.

(1) The starting material is double-sided copper-clad laminate (30Z) having insulative base (30A) and copper foils 32 laminated on both of its surfaces. The thickness of the insulative base is 100~400 μm. If the thickness is less than 100 μm, the substrate strength is too low. If the thickness exceeds 400 μm, the thickness of the printed wiring board is too thick. The insulative base has first surface (F) and second surface (S) opposite the first surface. Black-oxide treatment not shown in the drawing is conducted on surfaces of copper foils 32 (FIG. 9(A)).

(2) A laser is irradiated on double-sided copper-clad laminate (30Z) from the first-surface (F) side of the insulative base. First opening portions (31*a*) are formed, becoming narrower from the first surface of the insulative base toward the second surface (FIG. 9(B)).

(3) A laser is irradiated on double-sided copper-clad laminate (30Z) from the second-surface (S) side of the insulative base. Second opening portions (31*b*) are formed, becoming narrower from the second surface of the insulative base toward the first surface (FIG. 9(C)). Second opening portion (31*b*) is joined with first opening portion (31*a*) in the insulative base to form penetrating hole 31 for a through-hole conductor.

(4) Electroless plating is performed to form electroless plated film 33 on the inner walls of penetrating holes 31 and on copper foils 32 (FIG. 9(D)).

(5) Electrolytic plating is performed to form electrolytic plated film 37 on electroless plated film 33. Through-hole conductors 36 are formed in the penetrating holes. Through-hole conductors 36 are made up of electroless plated film 33 on the inner wall of the penetrating hole and electrolytic plated film 37 filled in the penetrating holes (FIG. 9(E)).

(6) Etching resist 35 with a predetermined pattern is formed on electrolytic plated film 37 on surfaces of insulative base 30 (FIG. 9(F)).

(7) Electrolytic plated film 37, electroless plated film 33 and copper foil 32 exposed from the etching resist are removed. Then, the etching resist is removed so that conductive layers (34A, 34B) and through-hole conductors 36 are formed (FIG. 10(A)).

(8) Opening 20 to accommodate an inductor component is formed by a drill in the center of insulative base (30A). Accordingly, the insulative base is completed (FIG. 10(B)). Thickness (CT) of the insulative base is approximately 150 μm (FIG. 10(B)).

(9) Tape 94 is laminated on second surface (S) of insulative base 30. Opening 20 is covered by the tape (FIG. 10(C)). An example of tape 94 is PET film.

(10) Inductor component 110 is placed on tape 94 exposed through opening 20 (FIG. 10(D)). The thickness of the inductor component accommodated in opening 20 of an insulative base is 30%~100% of the thickness of the insulative base.

(11) B-stage prepreg is laminated on first surface (F) of insulative base 30. Resin comes out of the prepreg into the opening by thermal pressing, and opening 20 is filled with filler (resin filler) 50 (FIG. 10(E)). The space between the inner wall of the opening and the inductor component is filled with the filler. The inductor component is fixed to the insulative base. Instead of prepreg, interlayer resin insulation film may be laminated. Prepreg includes reinforcing material such as glass, but interlayer resin insulation film does not include reinforcing material; both are preferred to contain inorganic particles such as glass particles. The filler contains inorganic particles of silica, for example.

(12) After the tape is removed (FIG. 11(A)), B-stage prepreg is laminated on second surface (S) of insulative base 30. Prepreg on the first and second surfaces of the insulative base is cured. Insulation layers (interlayer resin insulation layers) (50A, 50B) are formed on the first and second surfaces of the insulative base (FIG. 11(B)).

(13) By irradiating a CO2 gas laser from the first-surface side, openings (51A) for connection via conductors are formed in insulation layer (50A) to reach electrodes (158AD) of inductor component 110. At the same time, via-conductor openings 51 reaching conductive layer (34A) or through-hole conductors 36 are also formed. From the second-surface side, via-conductor openings 51 reaching conductive layer (34B) or through-hole conductors 36 are formed in insulation layer (50B) (FIG. 11(C)). Surfaces of insulation layers (50A, 50B) are roughened (not shown).

(14) Electroless plating is performed to form electroless plated film 52 on the inner walls of via-conductor openings and on the insulation layers (FIG. 11(D)).

(15) Plating resist 54 is formed on electroless plated film 52 (FIG. 12(A)).

(16) Next, electrolytic plating is performed to form electrolytic plated film 56 on the electroless plated film exposed from the plating resist (FIG. 12(B)).

(17) Next, plating resist 54 is removed using a 5% NaOH solution. Then, electroless plated film 52 exposed from the electrolytic copper-plated film is etched away so that conductive layers (58A, 58B) made of electroless plated film 52 and electrolytic plated film 56 are formed. Conductive layers (58A, 58B) include multiple conductive circuits and lands of via conductors. Simultaneously, via conductors (60A, 60B) and connection via conductors (60Aa) are formed (FIG. 12(C)). Via conductors (60A, 60B) connect conductive layers (58A, 58B) on insulation layers with conductive layers on the insulative base or through-hole conductors. Connection via conductors (60Aa) connect electrodes of the inductor component (input electrode, output electrode) and conductive layer (58A) on the insulation layer.

(18) Procedures shown in FIGS. 11(A)~12(C) are repeated to form uppermost and lowermost insulation layers (50C, 50D) on insulation layers (50A, 50B). Conductive layers (58C, 58D) are formed on uppermost and lowermost insulation layers (50C, 50D). Via conductors (60C, 60D) are formed in uppermost and lowermost insulation layers (50C, 50C). Conductive layers (58A, 58B) and conductive layers (58C, 58D) are connected by their respective via conductors (60C, 60D) (FIG. 12(D)). A first buildup layer is formed on the first surface of the insulative base, and a second buildup layer is formed on the second surface of the insulative base. Each buildup layer includes insulation layers, conductive layers and via conductors to connect different conductive layers. In the first embodiment, the first buildup layer further includes connection via conductors.

(19) Solder-resist layer 70 having openings 71 is formed on first and second buildup layers (FIG. 13A)). Openings 71 expose upper surfaces of conductive layers and via conductors. Those exposed portions work as pads.

(20) Metal film made of nickel layer 72 and gold layer 74 on nickel layer 72 is formed on the pads (FIG. 13(B)). Instead of nickel-gold layers, metal film made of nickel-palladium-gold layers may also be formed. In the printed wiring board shown in FIG. 1, connection via conductors are formed only in the first buildup layer. Thus, the second buildup layer does not have conductive circuits in the lower area of the inductor component. Inductance value is suppressed from lowering. When no conductive circuit is formed in the second buildup layer directly under the inductor component, the printed wiring board is more likely to warp. In such a case, the thickness of insulation layers of the first buildup layer is preferred to be greater than the thickness of the second buildup layer. Alternatively, the insulation layers of the first buildup layer are preferred not to contain reinforcing material while the second buildup layer contains reinforcing material. By so setting, warping of the printed wiring board is reduced.

(21) Next, solder bumps (76U) are formed on the pads of the first buildup layer, and solder bumps (76D) are formed on the pads of the second buildup layer. Printed wiring board 10 with solder bumps is completed (FIG. 1).

An IC chip is mounted on printed wiring board 10 through solder bumps (76U) (not shown). Then, the printed wiring board is mounted on a motherboard through solder bumps (76D).

Second Embodiment

FIG. 15(C) shows inductor component 110 according to a second embodiment. The same as in the first embodiment, inductor component 110 of the second embodiment is accommodated in the insulative base of a printed wiring board. In the first embodiment, magnetic film is formed on one surface of inductor component 110. By contrast, in the second embodiment, second magnetic body layers (174A, 174B) are formed on both surfaces of inductor component 110.

Penetrating hole 170 is formed in resin insulation layers (150Z, 150A, 150C, 150E) to be concentric to the inductor patterns. Columnar first magnetic body layer 172 is filled in the penetrating hole. Second magnetic body layer (174A) covers inductor pattern (158G) on resin insulation layer (150E). Opening (174*a*) of second magnetic body layer (174A) exposes terminal (158GD). Second magnetic body layer (174B) covers the lower-surface side of resin insulation layer (150Z). First magnetic body layer 172 and second magnetic body layers (174A, 174B) are made of the same material as that of the first embodiment.

In inductor component 110 of the second embodiment, by positioning first magnetic body layer 172 made of resin containing magnetic particles in the center of inductor patterns, and by forming second magnetic body layers (174A, 174B) on both surfaces, magnetic permeability is enhanced. Accordingly, desired inductance is achieved by a thin inductor component with fewer layers. Thus, a printed wiring board with the inductor component built into its insulative base is made thinner.

By providing magnetic body layers to cover inductor patterns on the outermost layers, magnetic flux is blocked and seldom leaks to the outside from inductor component 110 of the second embodiment. As a result, it is easier to secure desired inductor characteristics.

Figure 14:
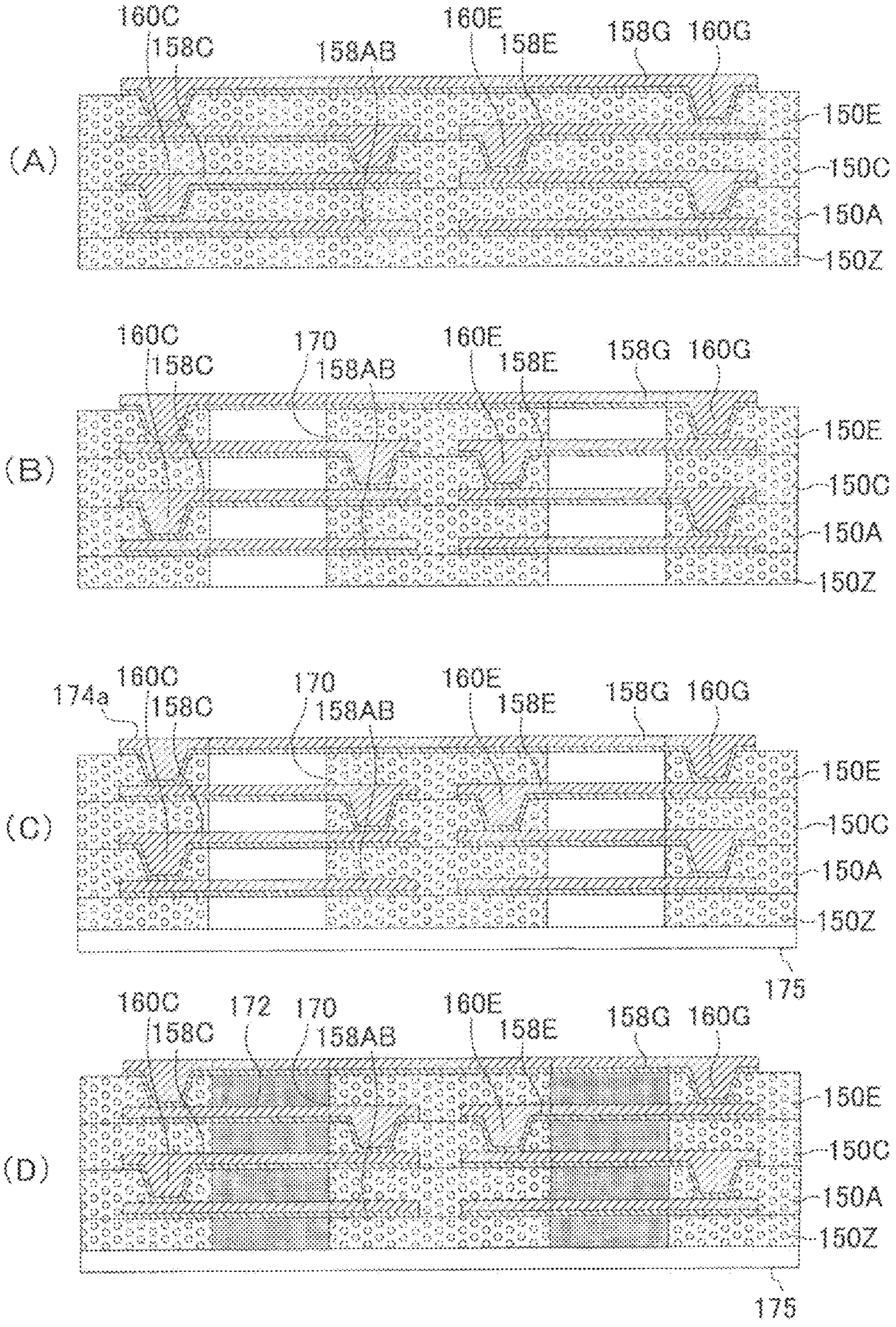
FIGS. 14(A)-14(D) are views of steps showing a method for manufacturing an inductor component according to a second embodiment.
Figure 15:
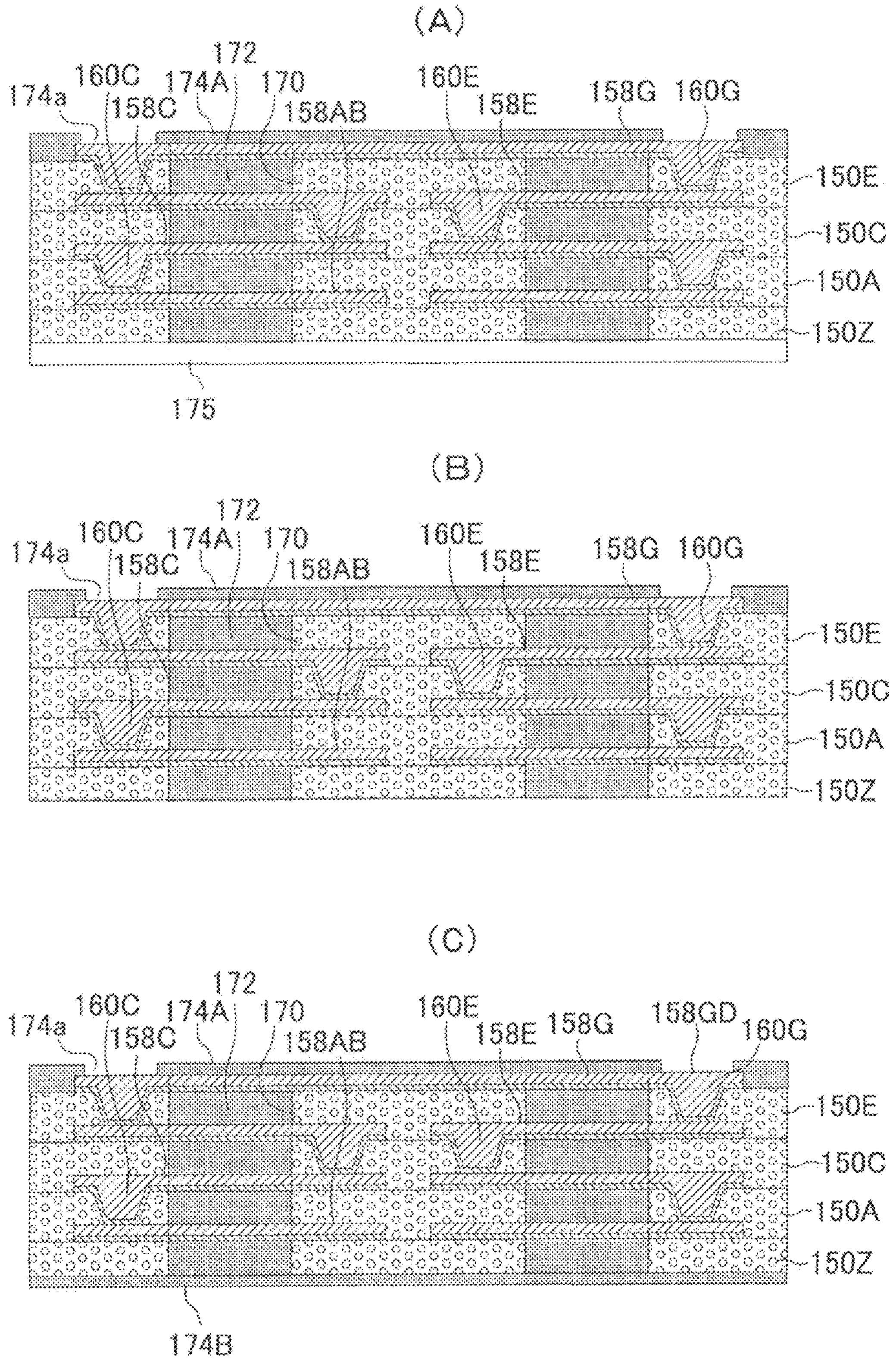
FIGS. 15(A)-15(C) are views of steps showing a method for manufacturing an inductor component according to the second embodiment.

FIGS. 14 and 15 show a method for manufacturing inductor component 110 of the second embodiment. By the same procedures shown in FIGS. 4(A)~6(B) of the first embodiment, a laminate is formed, which is made up of resin insulation layers (150Z, 150A, 150C, 150E), inductor patterns (158AB, 158C, 158E, 158G) and via conductors (160C, 160E, 160G) (FIG. 14(A)). Here, resin insulation layer (150Z) is formed on the lower-surface side of inductor pattern (158AB).

Using a laser or a drill, penetrating hole 170 is formed in resin insulation layers (150E, 150C, 150A, 150Z) to be concentric to each inductor pattern (FIG. 14(B)). Tape 175 is laminated on the lower surface of resin insulation layer (150Z). Penetrating hole 170 is covered by the tape (FIG. 14(C)). An example of tape 175 is PET film. A magnetic-material solution is filled in penetrating hole 170 the same as in the first embodiment and cured so that magnetic body layer 172 is formed in penetrating hole 170 (FIG. 14(D)).

Magnetic-layer film the same as in the first embodiment is laminated on inductor pattern (158G), and second insulative layer (174A) with openings (174*a*) is formed on inductor pattern (158G) (FIG. 15(A)). The tape is removed (FIG. 15(B)), magnetic-layer film is laminated on the lower surface of resin insulation layer 150 and thermally cured. Accordingly, second insulative layer (174B) is formed (FIG. 15(C)).

Third Embodiment

Figure 20:
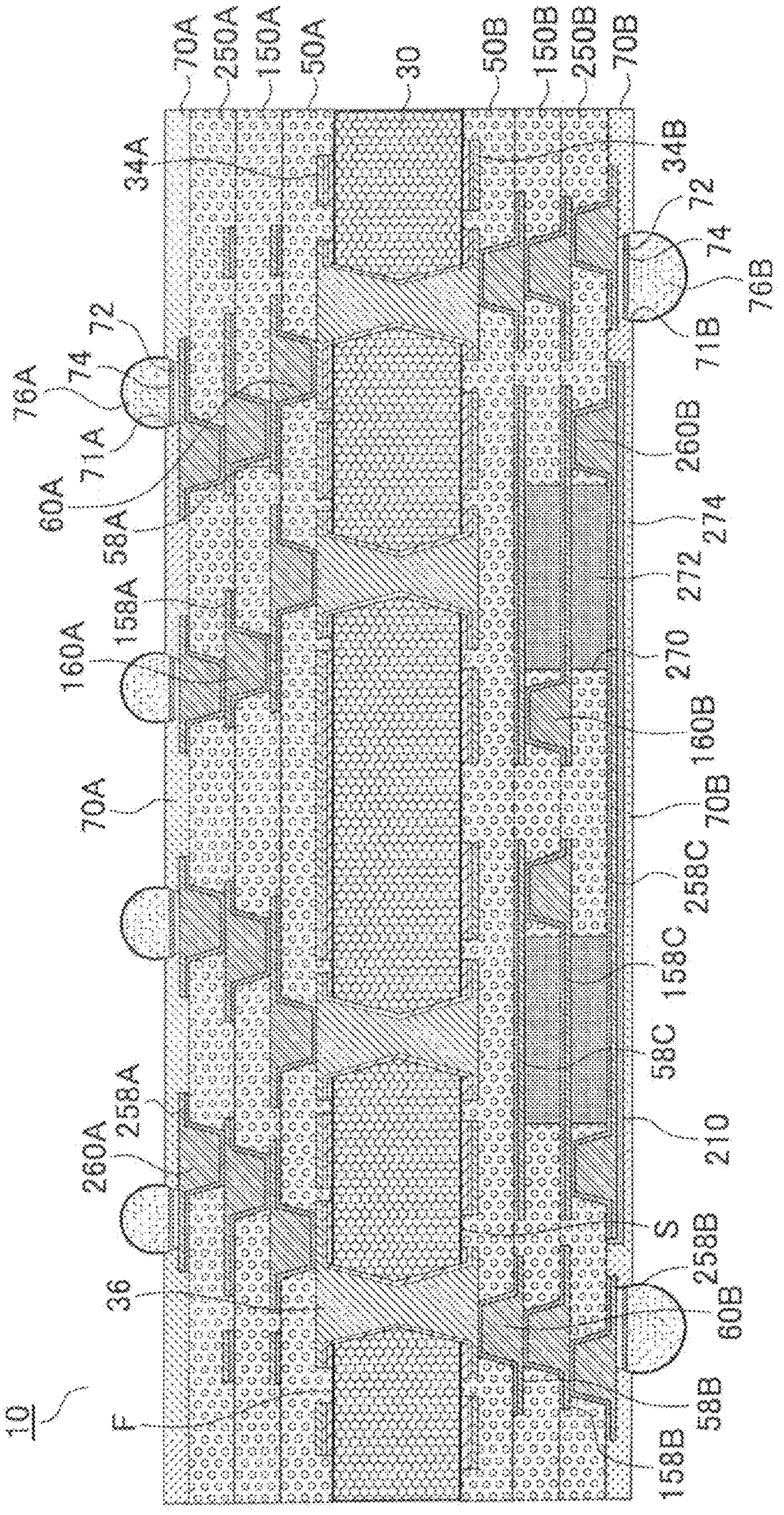
FIG. 20 is a view of a step showing a method for manufacturing a printed wiring board according to the third embodiment.

FIG. 20 shows a printed wiring board according to a third embodiment.

In the first and second embodiments, an inductor component was built into the insulative base of a printed wiring board. In the third embodiment, inductor 210 is formed in a first-surface (F) side buildup layer of the insulative base. Inductor 210 is made up of inductor pattern (58C) formed on interlayer resin insulation layer (50B), inductor pattern (158C) formed on interlayer resin insulation layer (150B), inductor pattern (258C) formed on interlayer resin insulation layer (250B) and via conductors (60B, 160B, 260B) connecting inductor patterns (58C, 158C, 258C), first magnetic body layer 272 filled in penetrating hole 270 formed in interlayer resin insulation layers (150B, 250B), and magnetic-material film 274 coating inductor pattern (258C).

FIGS. 16~19 show steps for forming an inductor in a printed wiring board.

Figure 16:
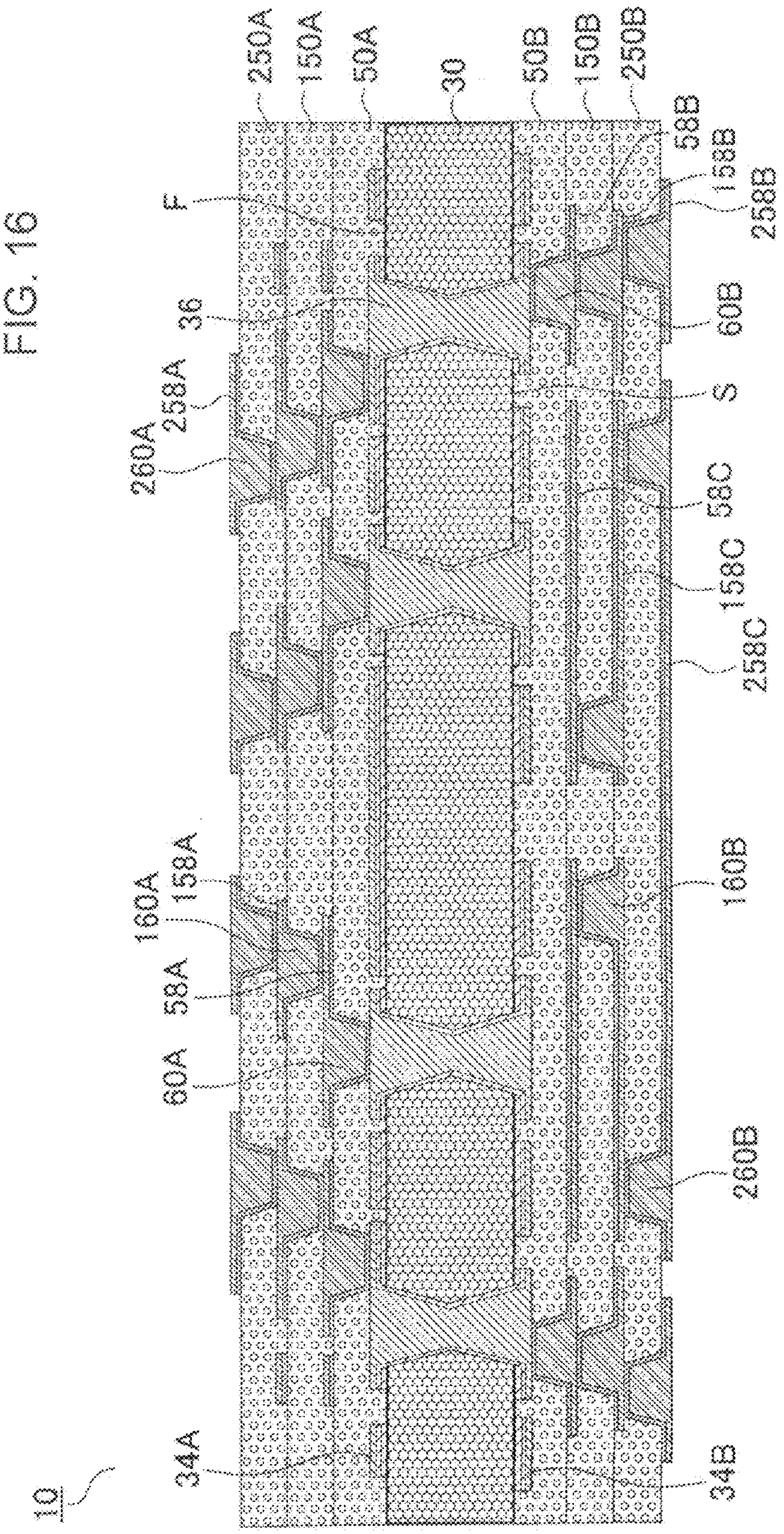
FIG. 16 is a view of a step showing a method for manufacturing a printed wiring board according to a third embodiment.

In the third embodiment, the following buildup layers are laminated on insulative base 30 as shown in FIG. 16 the same as shown in FIGS. 9~12: interlayer resin insulation layers (50A, 50B) having conductive patterns (58A, 58B) and via conductors (60A, 60B); interlayer resin insulation layers (150A, 150B) having conductive patterns (158A, 158B) and via conductors (160A, 160B); and interlayer resin insulation layers (250A, 250B) having conductive patterns (258A, 258B) and via conductors (260A, 260B). Here, on interlayer resin insulation layer (50B), inductor pattern (58C) is formed along with conductive pattern (58B); on interlayer resin insulation layer (150B), inductor pattern (158C) is formed along with conductive pattern (158B); and on interlayer resin insulation layer (250B), inductor pattern (258C) is formed along with conductive pattern (258B).

Figure 17:
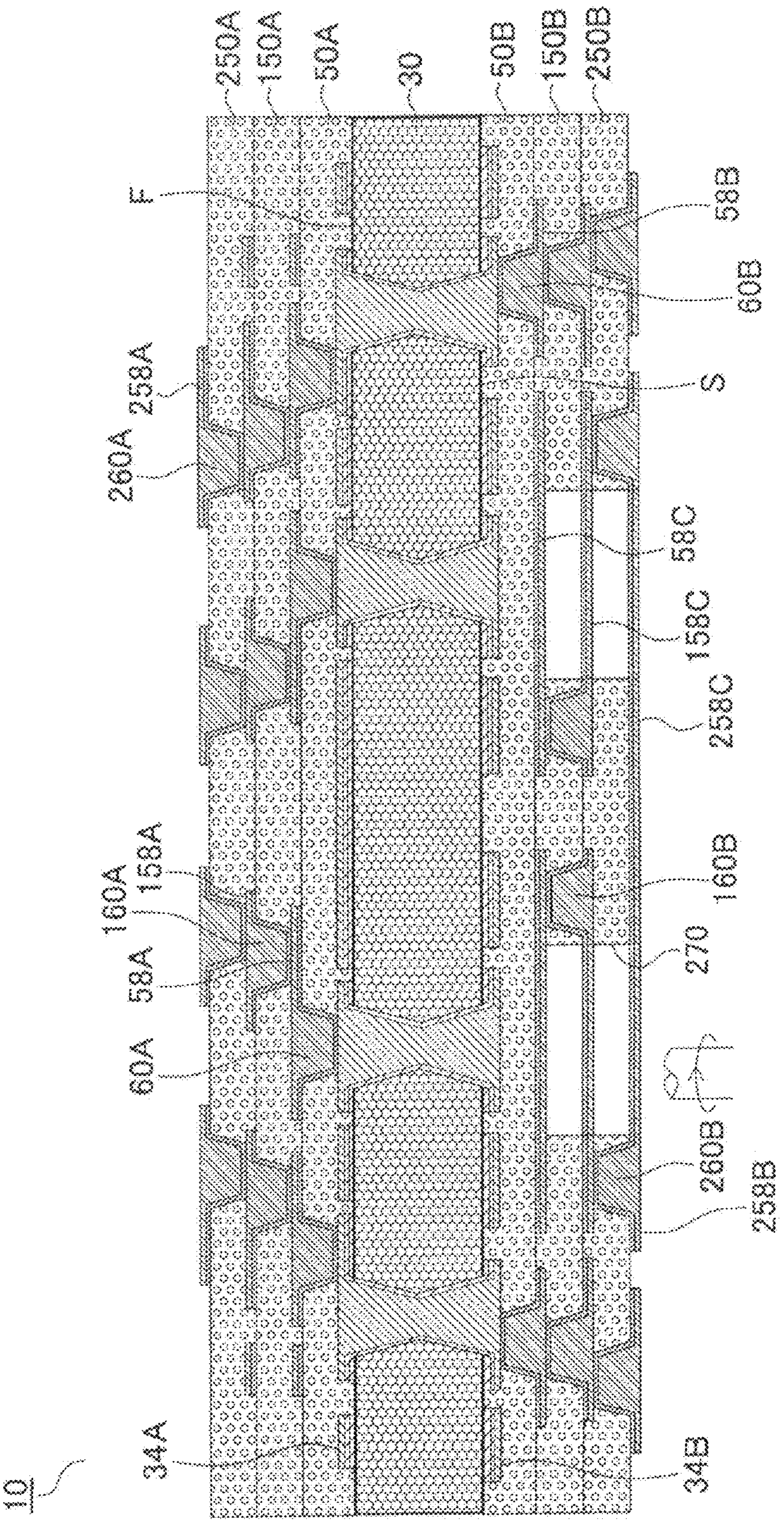
FIG. 17 is a view of a step showing a method for manufacturing a printed wiring board according to the third embodiment.

As shown in FIG. 17, a laser is used to form penetrating hole 270 in interlayer resin insulation layers (250B, 150B) to be concentric to inductor patterns (58C, 158C, 258C).

Figure 18:
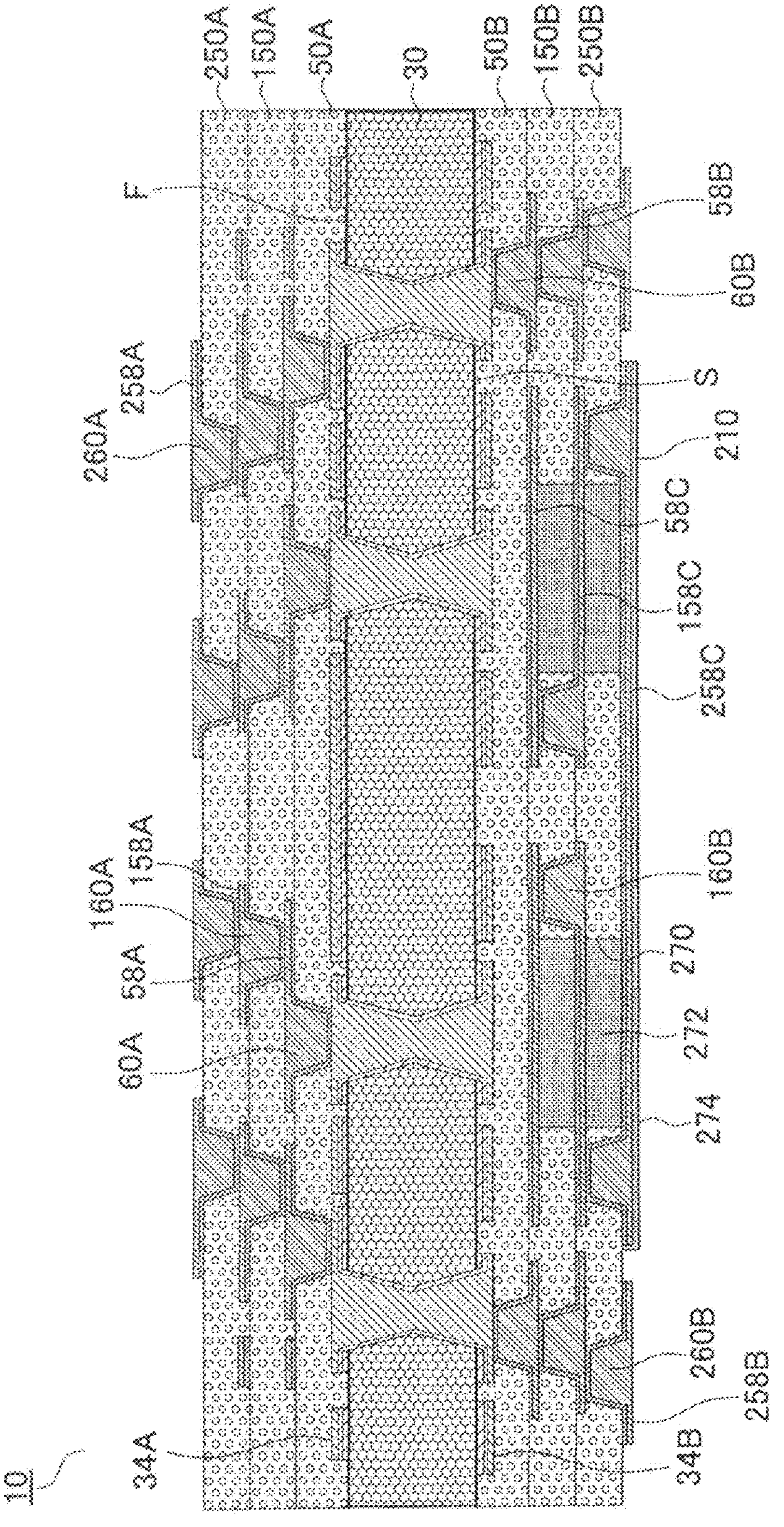
FIG. 18 is a view of a step showing a method for manufacturing a printed wiring board according to the third embodiment.

As shown in FIG. 18, a magnetic-material solution the same as in the first embodiment is filled in penetrating hole 270, magnetic-film layer the same as in the first embodiment is laminated on inductor pattern (258C), first magnetic body layer 272 is formed in penetrating hole 270 and insulative film 274 is formed on inductor pattern (258C).

Figure 19:
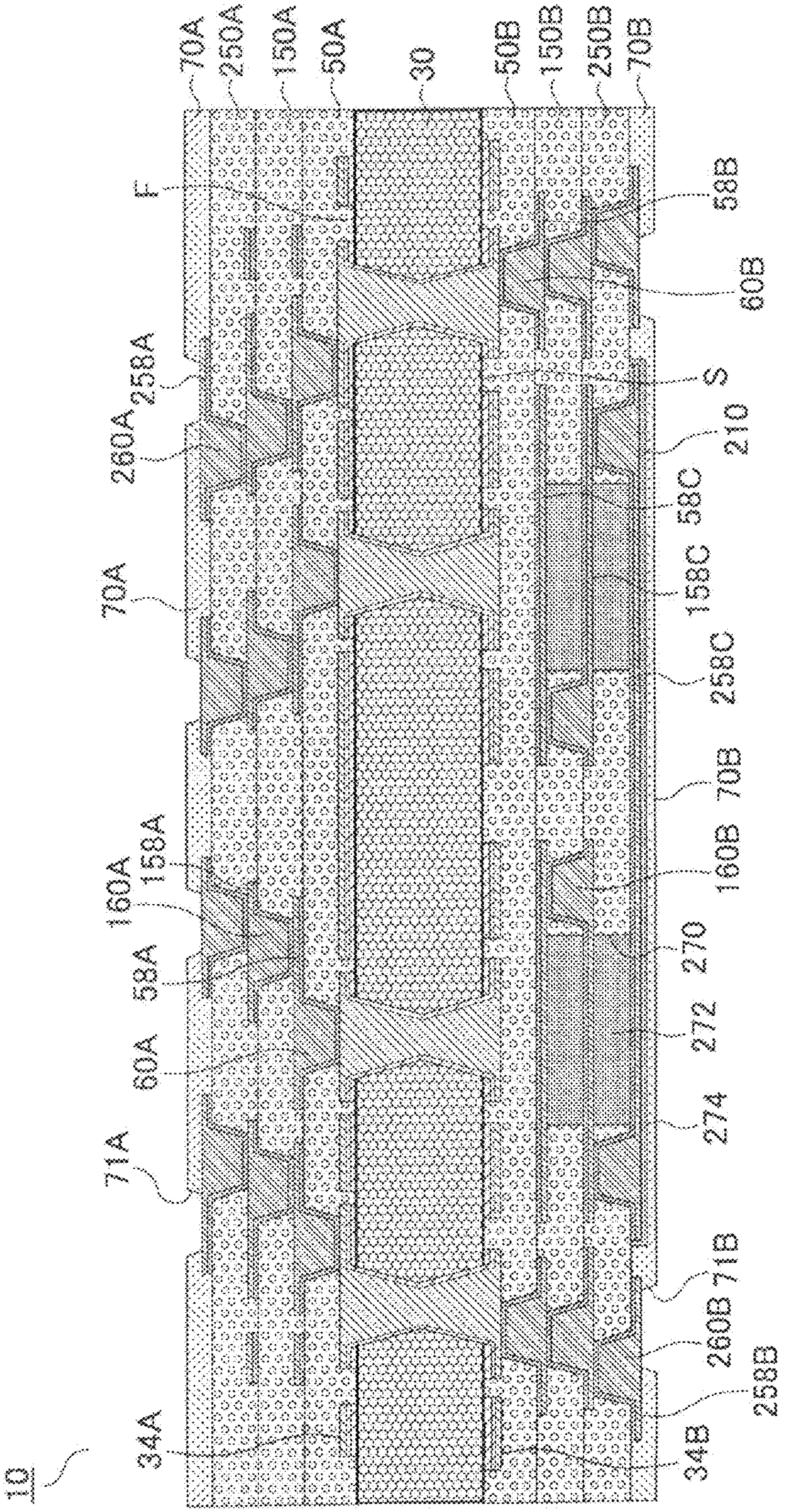
FIG. 19 is a view of a step showing a method for manufacturing a printed wiring board according to the third embodiment.

As shown in FIG. 19, solder-resist layers (70A, 70B) with openings (71A, 71B) are formed on outermost interlayer resin insulation layers (250A, 250B).

As shown in FIG. 20, solder bumps (76A, 76B) are formed in openings (71A, 71B) of the solder-resist layers.

Fourth Embodiment

Figure 21:
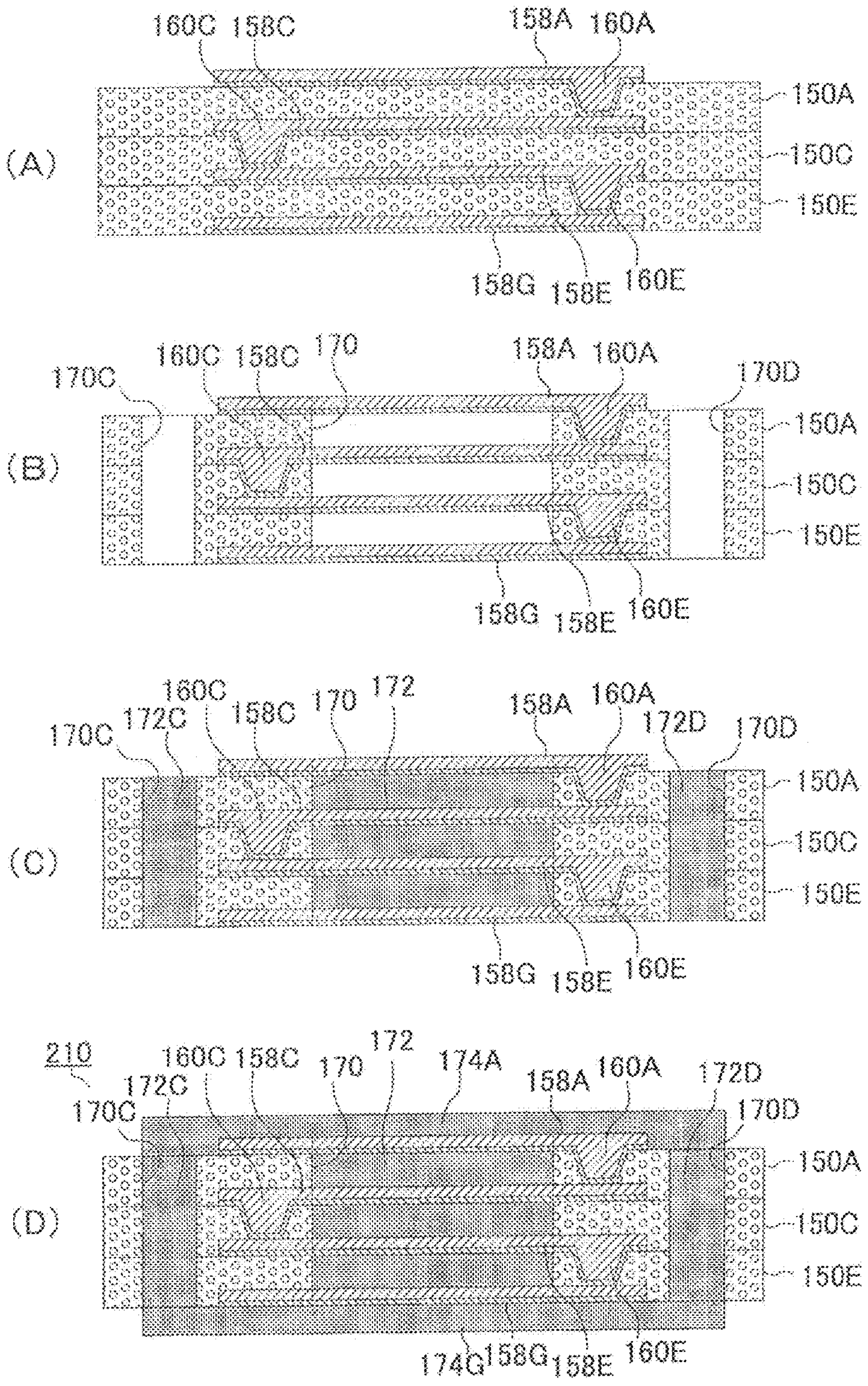
FIGS. 21(A)-21(D) are views of steps showing a method for manufacturing an inductor component according to a fourth embodiment.

FIG. 21(D) is a cross-sectional view of an inductor according to a fourth embodiment.

In inductor component 210 of the fourth embodiment, second penetrating holes (170C, 170D) are formed in the outer circumferential-side region of inductor patterns where no inductor is formed. Third magnetic body layers (172C, 172D) are filled in second penetrating holes (170C, 170D). Second penetrating holes (170C, 170D) are formed in an arc shape when seen in a lateral cross section.

In the fourth embodiment, magnetic body layers are also formed in regions where no inductor is formed. By so setting, it is easier to block magnetic flux toward side directions of the inductor and to secure desired inductor characteristics.

Regarding the method for manufacturing an inductor component according to the fourth embodiment, resin insulation layers (150A, 150C, 150E) and inductor patterns (158A, 158C, 158E, 158G) are formed the same as in the first embodiment (FIG. 21(A)), and then, first penetrating hole 170 is formed in the center of inductor patterns of the laminate, and second penetrating holes (170C, 170D) are formed in the outer circumferential-side region of the inductor patterns where no inductor is formed (FIG. 21(B)). First magnetic body layer 172 is filled in first penetrating hole 170, and third magnetic body layers (172C, 172D) are filled in second penetrating holes (170C, 170D) (FIG. 21(C)). Second magnetic body layer (174A) is formed on uppermost inductor pattern (158A), and second magnetic body layer (174G) is formed on the lowermost inductor pattern, thus completing the process (FIG. 12(D)).

According to an embodiment of the present invention, an inductor component is accommodated in or mounted on a printed wiring board and includes an insulation layer having a first penetrating hole, a first magnetic body layer formed in the first penetrating hole, and an inductor pattern formed on the insulation layer and on at least part of the circumferential portion of the first magnetic body layer.

In the inductor component according to an embodiment of the present invention, the magnetic permeability increases by forming a magnetic body layer in the shaft center of inductor patterns. Thus, desired inductor characteristics are achieved without increasing the number of inductor-pattern layers. Moreover, an inductor component of the present invention can be manufactured by a simplified process such as forming a penetrating hole in an insulation layer and forming a magnetic body layer in the penetrating hole.

Obviously, numerous modifications and variations of the present invention are possible in light of the above teachings. It is therefore to be understood that within the scope of the appended claims, the invention may be practiced otherwise than as specifically described herein.

What is claimed is:

1. An inductor device for a printed wiring board, comprising:

an insulation layer having a first penetrating hole penetrating through the insulation layer such that the first penetrating hole is extending from a first surface of the insulation layer to a second surface of the insulation layer on an opposite side with respect to the first surface;

a magnetic core structure comprising a magnetic material filled in the first penetrating hole through the insulation layer such that the magnetic core structure comprising a first magnetic body layer formed in the first penetrating hole is formed through the insulation layer and extending from the first surface to the second surface of the insulation layer;

a conductor layer formed on the first surface of the insulation layer and having an inductor pattern such that the inductor pattern is surrounding a circumference of an end portion of the magnetic core structure on the first surface of the insulation layer; and a second magnetic body layer formed on the inductor pattern such that the second magnetic body layer is covering the inductor pattern of the conductor layer, wherein the magnetic material forming the magnetic core structure comprises a resin material and magnetic particles included in the resin material.

2. The inductor device according to claim 1, further comprising an outermost insulation layer formed on the second magnetic body layer such that the outermost insulation layer is covering the second magnetic body layer.

3. The inductor device according to claim 1, wherein the inductor pattern has substantially an annular shape surrounding an end portion of the magnetic core structure on a surface of the insulation layer.

4. The inductor device according to claim 1, wherein the insulation layer is formed in a plurality, the conductor layer is formed in a plurality, and the plurality of insulation layers and the plurality of conductor layers form a multilayer structure comprising the conductor layers and the insulation layers alternately laminated.

5. The inductor device according to claim 4, further comprising a plurality of via conductors formed through the plurality of insulation layers, respectively, such that the plurality of via conductors connect the inductor patterns of the conductor layers, respectively.

6. The inductor device according to claim 4, wherein the first penetrating hole penetrates through the plurality of insulation layers.

7. The inductor device according to claim 1, further comprising a second magnetic core structure comprising a magnetic material such that the second magnetic core structure comprising a third magnetic body layer is formed in the insulation layer, wherein the inductor pattern forms an inductor-forming region, the insulation layer has a second penetrating hole penetrating through the insulation layer and formed in an inductorless region, the inductorless region is formed around the inductor-forming region, and the magnetic material forming the third magnetic body layer is filling the second penetrating hole.

8. The inductor device according to claim 2, wherein the inductor pattern forms an inductor-forming region, and the second magnetic body layer is formed on an entire portion of the inductor-forming region.

9. The inductor device according to claim 1, wherein the insulation layer includes a resin soluble to a roughening solution and a resin insoluble to the solution.

10. The inductor device according to claim 1, wherein the magnetic material forming the magnetic core structure comprises a resin material and magnetic particles in an amount in a range of 30 vol. % to 60 vol. % in the resin material.

11. A printed wiring board, comprising:

a buildup structure comprising a plurality of insulation layers and a plurality of conductive layers; and an inductor device accommodated in or mounted on the buildup structure, the inductor device comprising an insulation layer having a first penetrating hole penetrating through the insulation layer such that the first penetrating hole is extending from a first surface of the insulation layer to a second surface of the insulation layer on an opposite side with respect to the first surface, a magnetic core structure comprising a magnetic material filled in the first penetrating hole through the insulation layer such that the magnetic core structure comprising a first magnetic body layer formed in the first penetrating hole is formed through the insulation layer and extending from the first surface to the second surface of the insulation layer, a conductor layer formed on the first surface of the insulation layer and having an inductor pattern such that the inductor pattern is surrounding a circumference of an end portion of the magnetic core structure on the first surface of the insulation layer, and a second magnetic body layer formed on the inductor pattern such that the second magnetic body layer is covering the inductor pattern of the conductor layer, and the magnetic material comprising a resin material and magnetic particles included in the resin material.

12. The printed wiring board according to claim 11, wherein the insulation layers and the conductive layers in the buildup structure are alternately laminated, and the conductive layers are connected by a plurality of via conductors formed through the insulation layers.

13. The printed wiring board according to claim 11, wherein the inductor device further has a second magnetic core structure comprising a magnetic material such that the second magnetic core structure comprising a third magnetic body layer is formed in the insulation layer, the inductor pattern forms an inductor-forming region, the insulation layer has a second penetrating hole penetrating through the insulation layer and formed in an inductorless region, the inductorless region is formed around the inductor-forming region, and the magnetic material forming the third magnetic body layer is filling the second penetrating hole.

14. The inductor device according to claim 5, wherein the inductor pattern of each of the conductor layers comprises a semicircular coil wiring pattern, and the plurality of via conductors is positioned such that electric current flows in substantially semicircle through each of the inductor patterns of the conductor layers.

15. The inductor device according to claim 14, wherein the first penetrating hole penetrates through the plurality of insulation layers.

16. The inductor device according to claim 5, wherein the inductor pattern of each of the conductor layers has substantially annular shape surrounding an end portion of the magnetic core structure on a surface of each of the insulation layers and comprising two semicircular coil wiring patterns, and the plurality of via conductors is positioned such that electric current flows in substantially semicircle through each of the inductor patterns of the conductor layers.

* * * * *